United States Patent
Ramvall et al.

(10) Patent No.: US 11,164,939 B2
(45) Date of Patent: Nov. 2, 2021

(54) TUNNEL FIELD-EFFECT TRANSISTOR AND METHOD FOR FORMING THE SAME

(71) Applicant: TAIWAN SEMICONDUCTOR MANUFACTURING CO., LTD., Hsinchu (TW)

(72) Inventors: Peter Ramvall, Lund (SE); Gerben Doornbos, Leuven (BE); Matthias Passlack, Huldenberg (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/020,759

(22) Filed: Jun. 27, 2018

(65) Prior Publication Data

US 2020/0006473 A1 Jan. 2, 2020

(51) Int. Cl.
| | |
|---|---|
| H01L 29/78 | (2006.01) |
| H01L 29/04 | (2006.01) |
| H01L 21/02 | (2006.01) |
| H01L 21/331 | (2006.01) |

(52) U.S. Cl.
CPC ........ *H01L 29/045* (2013.01); *H01L 21/0243* (2013.01); *H01L 21/02433* (2013.01); *H01L 21/02609* (2013.01); *H01L 29/7851* (2013.01)

(58) Field of Classification Search
CPC ........... H01L 29/66356; H01L 29/7391; H01L 29/7392; H01L 29/66666; H01L 29/7827; H01L 29/7828; H01L 29/78642; H01L 29/42392
See application file for complete search history.

(56) References Cited

U.S. PATENT DOCUMENTS

| | | | | |
|---|---|---|---|---|
| 8,729,634 | B2* | 5/2014 | Shen | H01L 29/7853 257/368 |
| 9,613,955 | B1* | 4/2017 | Anderson | H01L 27/0886 |
| 9,837,405 | B1* | 12/2017 | Cheng | H01L 27/0886 |
| 2009/0039361 | A1* | 2/2009 | Li | H01L 21/02381 257/94 |
| 2010/0252836 | A1* | 10/2010 | Kishino | H01L 21/0254 257/76 |
| 2013/0161696 | A1* | 6/2013 | Verhulst | H01L 29/78 257/192 |
| 2013/0334500 | A1* | 12/2013 | Smets | H01L 29/7391 257/39 |
| 2014/0203351 | A1* | 7/2014 | Chuang | H01L 21/26513 257/329 |

(Continued)

OTHER PUBLICATIONS

Wenjun Li et al., "Polarization-Engineered III-Nitride Heterojunction Tunnel Field-Effect Transistors" IEEE Journal on Exploratory Solid-State Computational Devices and Circuits, vol. 1, Feb. 2015, p. 28-34.

(Continued)

*Primary Examiner* — Eric A. Ward
(74) *Attorney, Agent, or Firm* — Maschoff Brennan

(57) ABSTRACT

A device includes a first epitaxial layer, a second epitaxial layer, an interlayer, a gate dielectric layer, and a gate layer. The interlayer is between the first epitaxial layer and the second epitaxial layer. The gate dielectric layer is around the interlayer. The gate layer is around the gate dielectric layer and the interlayer. The interlayer is slanted with respect to a sidewall of the gate layer.

20 Claims, 23 Drawing Sheets

(56) References Cited

U.S. PATENT DOCUMENTS

| | | | | |
|---|---|---|---|---|
| 2014/0299923 | A1* | 10/2014 | Chang | H01L 21/26533 |
| | | | | 257/288 |
| 2016/0099343 | A1* | 4/2016 | Pawlak | H01L 29/0834 |
| | | | | 257/12 |
| 2016/0233246 | A1* | 8/2016 | Anderson | H01L 29/7853 |
| 2016/0336324 | A1* | 11/2016 | Li | H01L 27/0928 |
| 2017/0125521 | A1 | 5/2017 | Fay et al. | |
| 2017/0125555 | A1 | 5/2017 | Fay et al. | |
| 2018/0013000 | A1* | 1/2018 | Rachmady | H01L 29/42392 |
| 2018/0190802 | A1* | 7/2018 | Yang | H01L 29/083 |

OTHER PUBLICATIONS

Yoshio Honda et al., "Growth of (1101) GaN on a 7-degree off-oriented (0 0 1)Si substrate by selective MOVPE" Journal of Crystal Growth 242 (Apr. 2002) p. 82-86.

Weijie Chen et al., "GaN nanowire fabricated by selective wet-etching of GaN micro truncated-pyramid" Journal of Crystal Growth 426 (Apr. 2015) p. 168-172.

L. M. Terman, "An Investigation of Surface States at a Silicon/Silicon Oxide Interface Employing Metal-Oxide-Silicon Diodes" Solid-States Electronics Pergamon Press, Oct. 1962 vol. 5, p. 285-299.

* cited by examiner

TUNNEL FIELD-EFFECT TRANSISTOR AND METHOD FOR FORMING THE SAME

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. Field effect transistors (FETs) are widely used in integrated chips. FETs comprise a source, a drain, and a gate. A large subthreshold slope (i.e., a small subthreshold swing) is typically desired since it improves the ratio between on and off currents, and therefore reduces leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
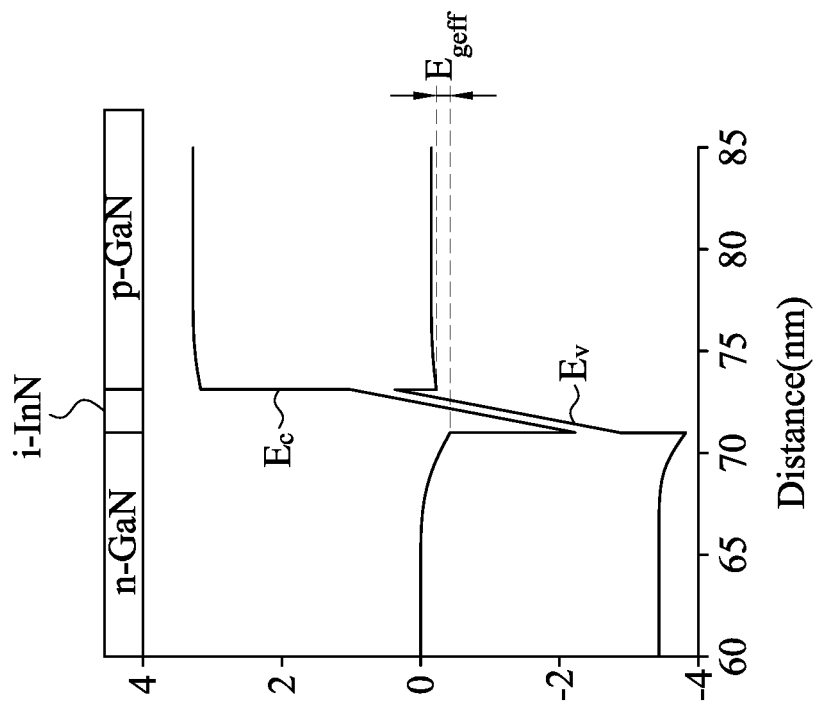
FIG. 1A is a band diagram for an example semiconductor device including a polar GaN/InN/polar GaN heterojunction with 1.4 nm InN layer thickness according to one or more techniques of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Tunnel field-effect transistor is (TFET) a promising candidate to replace metal-oxide-semiconductor field-effect transistor (MOSFET) in low-voltage, energy-efficient and ultra-scaled integrated circuits. By using quantum-mechanical tunneling instead of thermionic emission, TFET have the potential to achieve switching slopes (SS) less than 60 mV/decade. TFET devices using III-V materials with narrow band gaps, such as indium arsenide (InAs) and gallium antimonide (GaSb), achieve a high on-current ($I_{ON}$), but these devices also show a large off-current ($I_{OFF}$) and as such, may not achieve an acceptable $I_{ON}/I_{OFF}$ ratio.

In order to lower $I_{OFF}$, a TFET device may use group III-V compounds exhibiting wide band gaps as semiconductor materials as a substitute for group III-V compounds exhibiting narrow band gaps. Candidate group III-V compounds exhibiting wide band gaps include group III-nitrides, such as, for example, gallium nitride (GaN), aluminum nitride (AlN), or the like. As used herein, the term "narrow band gap" may refer to a band gap less than the band gap of Silicon, (e.g., less than 1.1 electron volt (eV) or less than 0.7 eV), or a band gap less than a wide band gap. As used herein, the term "wide band gap" may refer to a band gap greater than the band gap of Indium Nitride (InN) (i.e., 0.7 eV) or a band gap greater than 3.0 eV.

However, for devices utilizing group III-nitrides compounds, the wide band gap may frustrate interband tunneling in group III-nitride homojunctions. Thus, embodiments of the present disclosure provide the TFET based on group III-nitride compound heterojunctions through the use of polarization engineering. Through polarization engineering of the heterostructure, a polarization-induced charge can be used to generate large internal electric fields. At sufficiently high electric fields, interband tunneling can become significant even in large band gap materials (e.g., III-nitride materials).

Figure 1B:
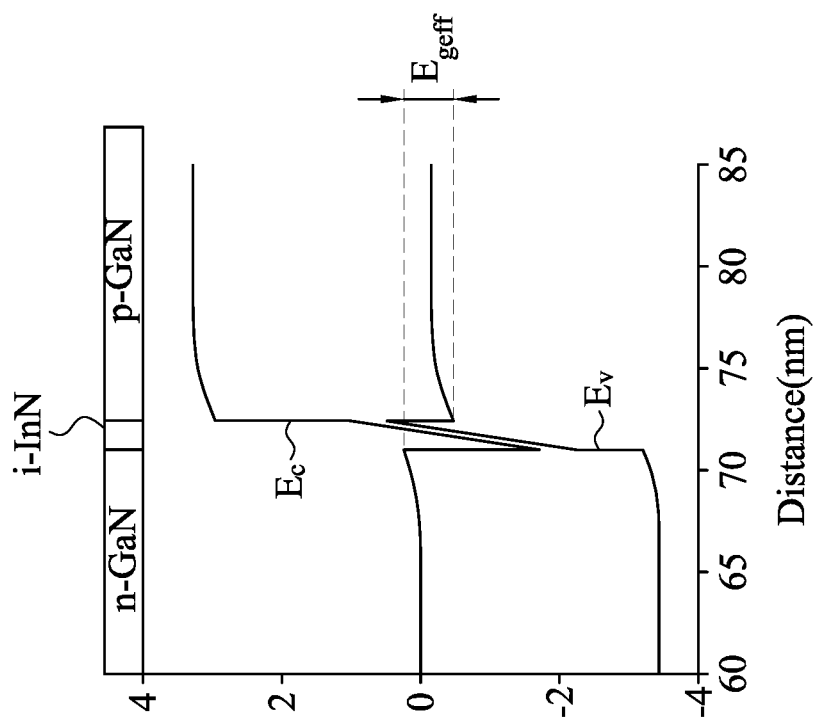
FIG. 1B is a band diagram for an example semiconductor device including a polar GaN/InN/polar GaN heterojunction with 2.4 nm InN layer thickness according to one or more techniques of this disclosure.

To illustrate the concept of interband tunneling in III-nitride heterojunctions, FIGS. 1A and 1B show example band diagrams for two polar GaN/InN/polar GaN heterostructures. FIG. 1A is a band diagram for an example semiconductor device including polar GaN/InN/polar GaN heterojunctions with 1.4 nm InN layer thickness. FIG. 1B is a band diagram for an example semiconductor device including polar GaN/InN/polar GaN heterojunctions with 2.4 nm InN layer thickness. In the examples illustrated in FIGS. 1A and 1B, the offset between the p-GaN valence band (Ev) edge at the polar p-GaN/InN interface and the n-GaN conduction band (Ec) edge at the polar n-GaN/InN interface can be considered as an effective band gap $E_{g_{eff}}$. In the example illustrated in FIG. 1A, the energy band is a staggered-gap alignment and $E_{g_{eff}}$ is approximately 0.64 eV, which is practical to realize the interband tunneling. In the example illustrated in FIG. 1B, when the thickness of the InN layer is increased to 2.4 nm, a broken-gap alignment occurs and $E_{g_{eff}}$ is approximately −0.37 eV, which is practical to realize the interband tunneling as well. As described in further detail below, this property, i.e., that the thickness of the InN layer in a polar GaN/InN/polar GaN heterojunction may change band gap characteristics, may enable a diverse range of TFETs to be developed. For example, the polar GaN/InN/polar GaN heterojunction with the staggered band gap alignment may result in low off-current and the polar GaN/InN/polar GaN heterojunction with the broken band gap alignment may result in high on-current. In some embodiments, when the thickness of the InN layer is increased over 3 nm, the on-current may be unsatisfactory for the TFET because of an increased tunneling distance.

Moreover, GaN is most stable in the hexagonal wurtzite crystal structure, in which the structure is described by three equivalent basal plane axes that are rotated 120° with respect to each other (the a-axes), all of which are perpendicular to a unique c-axis. A plane that intersects with the c axis at right angles is called a "c-plane." In this case, the "c-plane" is a generic term that collectively refers to a family of planes including (0001) and (000-1) planes.

Group III and nitrogen atoms occupy alternating c-planes along the crystal's c-axis. The symmetry elements included in the wurtzite structure dictate that III-nitrides possess a bulk spontaneous polarization along this c-axis. Furthermore, as the wurtzite crystal structure is non-centrosymmetric, wurtzite nitrides can additionally exhibit piezoelectric polarization, also along the crystal's c-axis. Therefore, c-planes of the III-nitride material can be equivalently referred to as polar planes that contribute to interband tunneling.

Figure 2A:
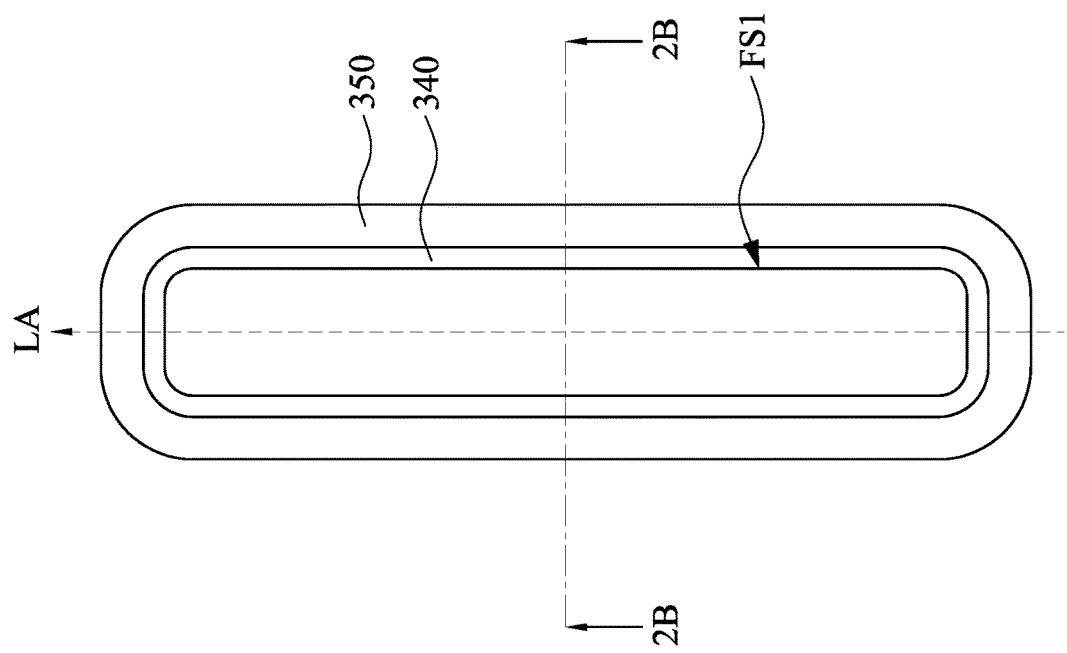
FIG. 2A is a schematic top view of a tunnel field-effect transistor in accordance with some embodiments of the present disclosure.
Figure 2B:
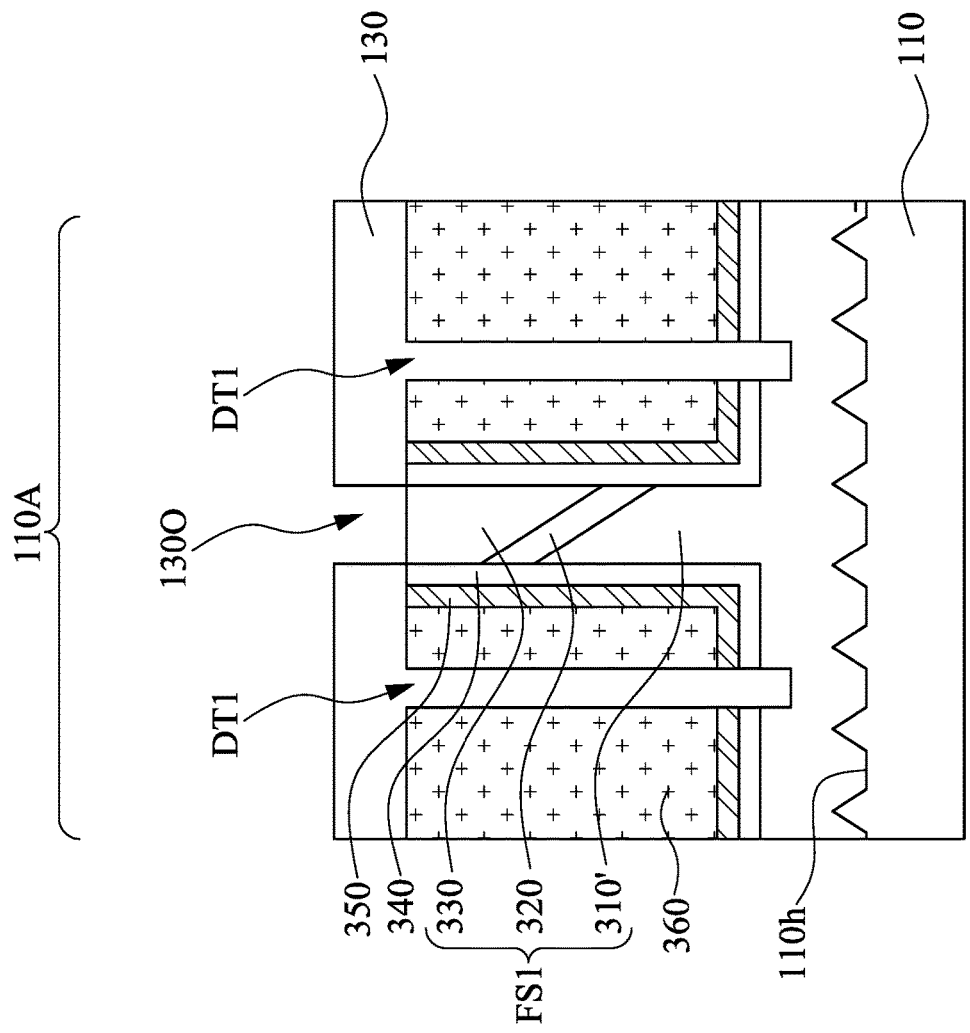
FIG. 2B is a cross-sectional view taking along line 1B-1B of FIG. 1A.

FIG. 2A is a schematic top view of a tunnel field-effect transistor (TFET) 300 in accordance with some embodiments of the present disclosure. FIG. 2B is a cross-sectional view taking along line 2B-2B of FIG. 2A. The TFET 300 includes a substrate 110, a source-layer 310', an interlayer 320, a drain-layer 330, a gate dielectric layer 340, and a metal gate layer 350. The interlayer 320 is between the source-layer 310' and the drain-layer 330. The interlayer 320 is slanted with respect to a horizontal surface 110h of the substrate 110. The source-layer 310', the interlayer 320, and the drain-layer 330 together form a fin structure FS1 that have vertical sidewalls with respect to the horizontal (001) surface 110h of the substrate 110. The gate dielectric layer 340 surrounds the fin structure FS1. The metal gate layer 350 surrounds the gate dielectric layer 340 and the fin structure FS1. In some embodiments of the present disclosure, the interlayer 320 is slanted with respect to the vertical sidewalls of the metal gate layer 350.

Herein, an interface between the source-layer 310' and the interlayer 320 extend along a polar c-plane, and an interface between the interlayer 320 and the drain-layer 330 extend along a polar c-plane as well. Through the configuration, interband tunneling inside the fin structure FS1 is achievable, which in turn results in switching slopes (SS) less than 60 mV/decade.

Figure 3A:
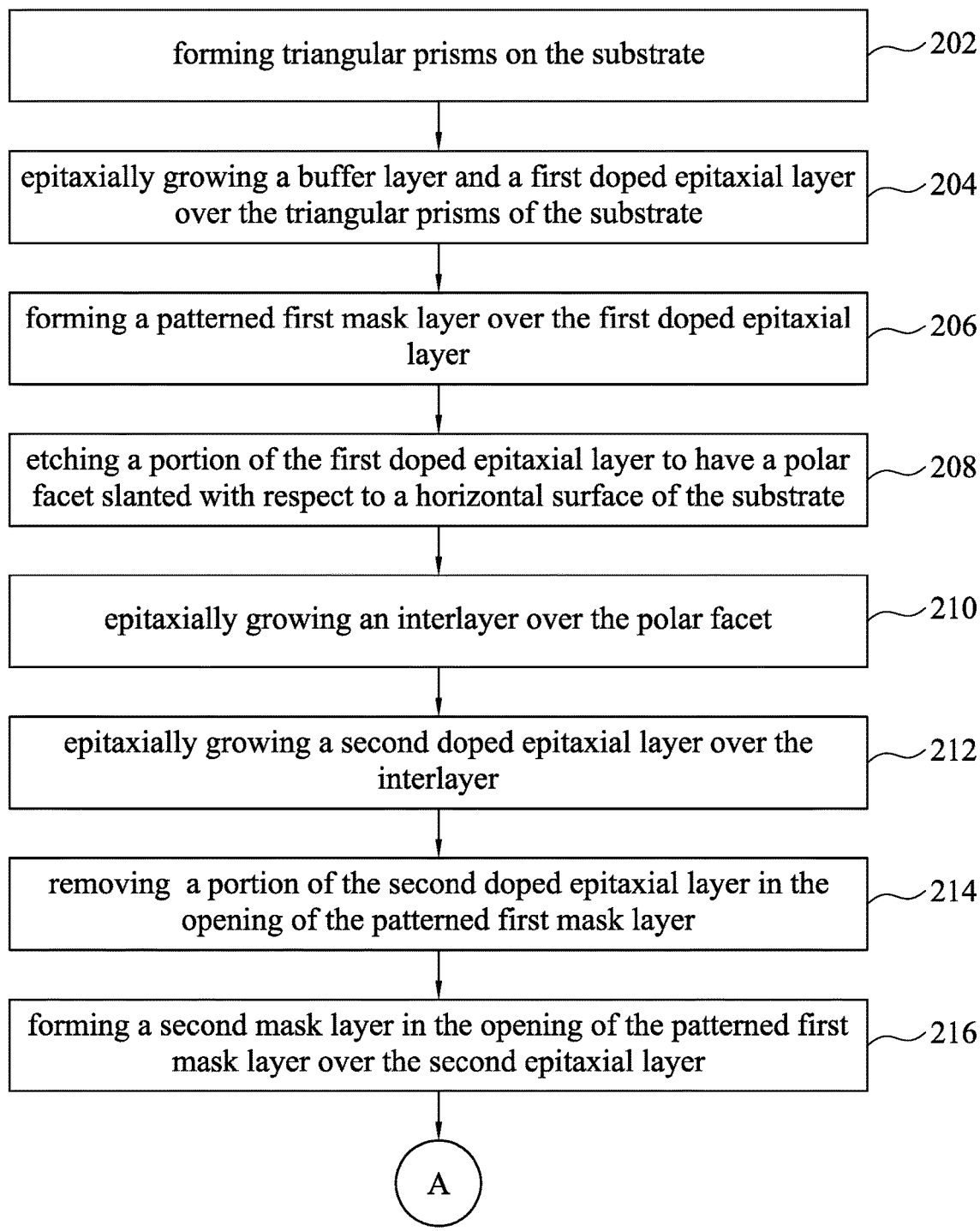
FIGS. 3A and 3B are flow charts of a method of forming a tunnel field-effect transistor in accordance with some embodiments of the present disclosure.
Figure 3B:
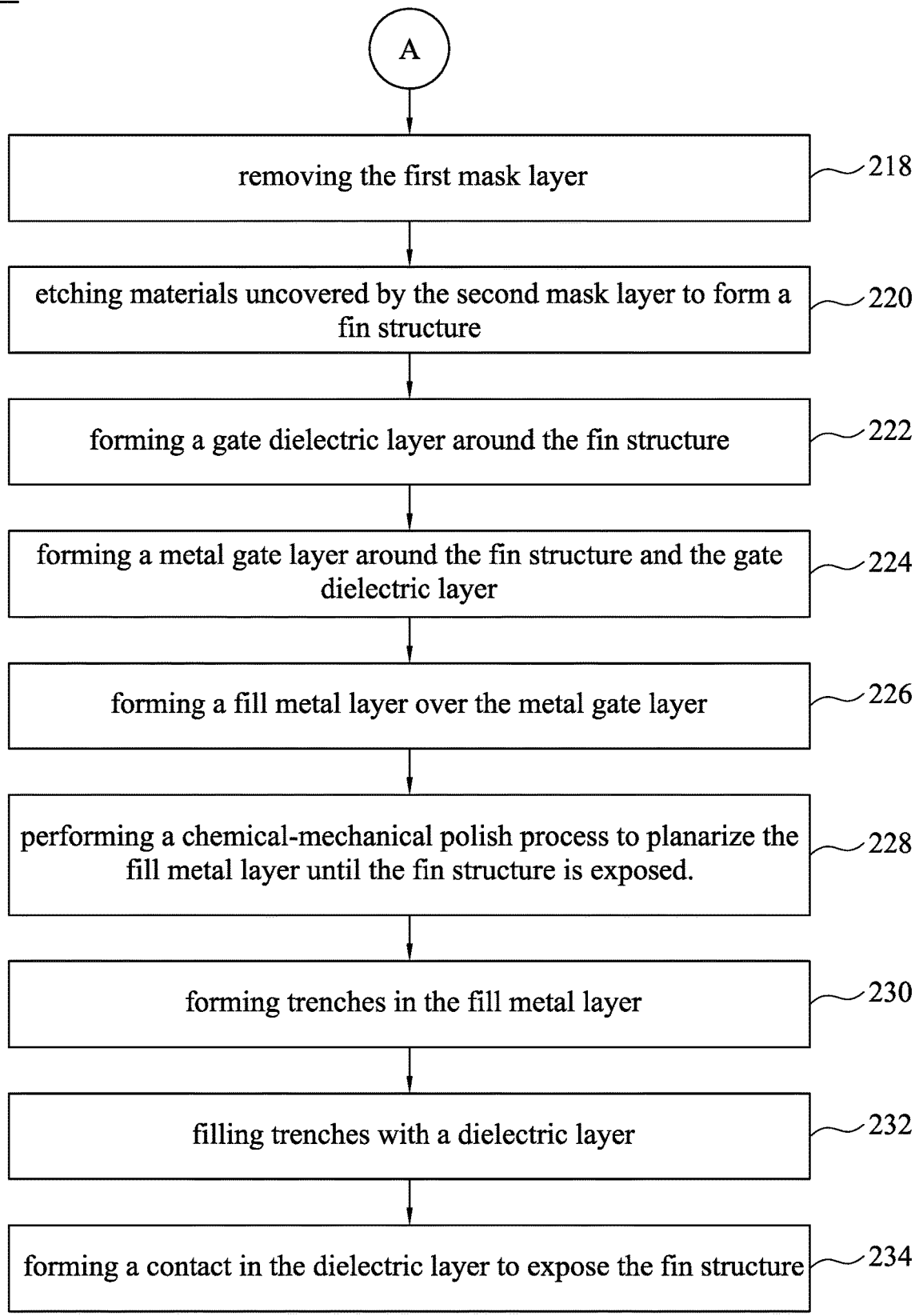

FIGS. 3A and 3B are flow charts of a method 200 of forming TFETs 300 and 400 in accordance with some embodiments of the present disclosure. FIGS. 4-21 illustrating a method 200 for forming TFETs 300 and 400 at various stages in accordance with some embodiments of the present disclosure. The illustration is merely exemplary and is not intended to be limiting beyond what is specifically recited in the claims that follow. It is understood that additional operations may be provided before, during, and after the operations shown by FIGS. 3A and 3B, and some of the operations described below can be replaced or eliminated for additional embodiments of the method. The order of the operations/processes may be interchangeable.

Figure 4:
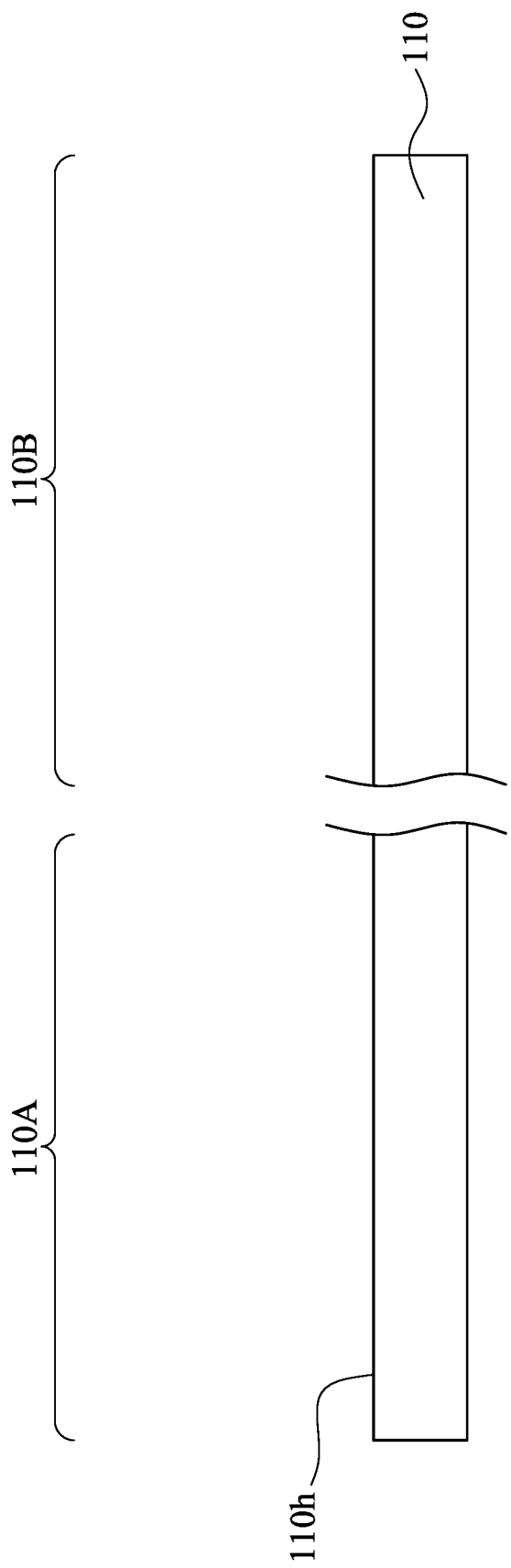
FIGS. 4-21 illustrating a method for forming a tunnel field-effect transistor at various stages in accordance with some embodiments of the present disclosure.

Referring to FIG. 4. A substrate 110 is illustrated, and the substrate 110 may include a first region 110A and a second region 110B. The first region 110A may be for forming p-type devices, such as p-type TFETs, and the second region 110B may be for forming n-type devices, such as n-type TFETs. The substrate 110 may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 5:
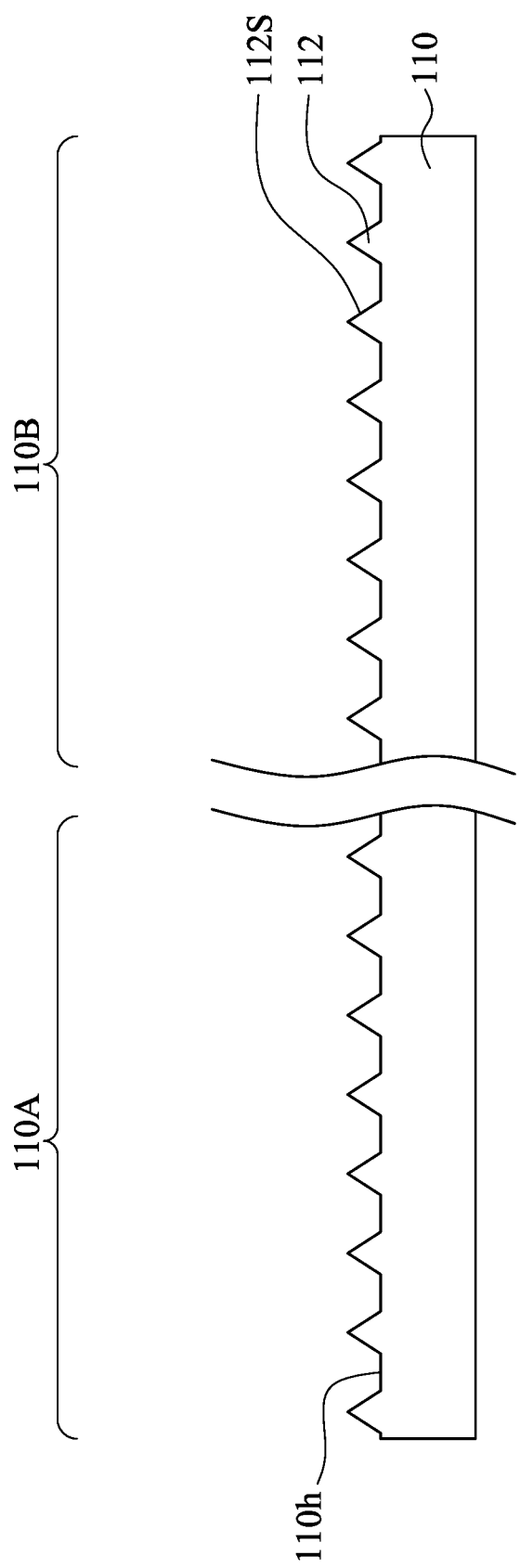

Returning to FIG. 3A, operation 202 of the method 200 includes forming triangular prisms 112 on the substrate 110, as illustrated in FIG. 5. With reference to FIG. 5, in some embodiments of operation 202, a plurality of triangular prisms 112 are formed on the substrate 110 using, for example, suitable etching techniques. The triangular prisms 112 extend along the same direction, and the triangular prisms 112 have slanted facets 112S with a (111) crystal orientation. Stated another way, the slanted facets 112S of the triangular prisms 112 are on (or extend along) a (111) plane. The triangular prisms 112 are formed by a photolithography and etching process. The photolithography and etching process includes photoresist application, exposure, developing, etching, and photoresist removal. The photoresist is applied onto the substrate 110 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the substrate 110 which are not protected by the remaining photoresist are etched, while other portions of the substrate 110 protected by the photoresist remain to form the triangular prisms 112. After etching the substrate 110, the photoresist is removed from the substrate 110 by, for example, ashing or stripping.

The etching of the substrate 110 may be, for example, anisotropic wet etching. When the substrate 110 is made of crystalline silicon, an etchant used to etch the substrate 110 may be, for example, a potassium hydroxide (KOH)-based solution, an ethylenediamine pyrocatechol (EPD)-based solution, a tetramethylammonium hydroxide (TMAH)-based solution, or combinations thereof. KOH displays an etch rate selectivity about 400 times higher in <100> crystal directions than in <111> directions. EPD displays an etch rate selectivity about 35 times higher in <100> crystal directions than in <111> directions. TMAH displays an etch rate selectivity from about 12.5 to about 50 times higher in <100> crystal directions than in <111> directions. Therefore, the triangular prisms 112 formed by the anisotropic wet etching have facets 112S extending along the (111) plane, and shows inverted V-shaped cross sections.

Figure 6:
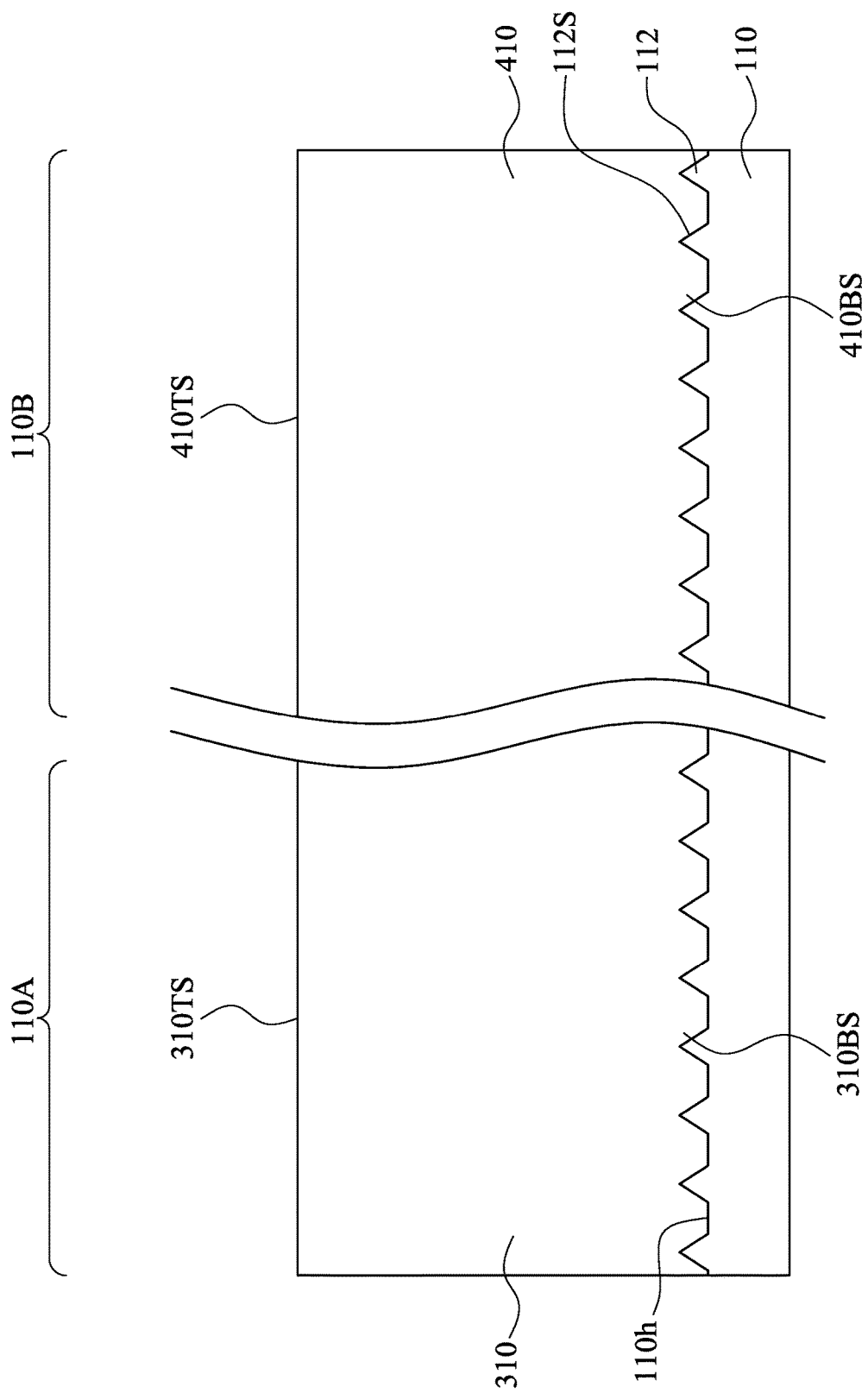

Returning to FIG. 3A, the method 200 then proceeds to operation 204 where first doped epitaxial layers are epitaxially grown over the triangular prisms 112 of the substrate 110, as illustrated in FIG. 6. With reference to FIG. 6, in some embodiments of operation 204, first doped epitaxial layers 310 and 410 are respectively formed over the first and second regions 110A and 110B of the substrate 110, and over the triangular prisms 112.

The first doped epitaxial layers 310 and 410 are III-N compound semiconductor layers including a material selected from GaN, InN, AlN, $In_xGa_{(1-x)}N$, $Al_xGa_{(1-x)}N$, $Al_xIn_{(1-x)}N$, $Al_xIn_yGa_{(1-x-y)}N$, the like, and combinations thereof, in which "x" is in a range of 0 to 1, and "y" is in a range of 0 to 1. Epitaxy growth method of the III-N compound semiconductor layers includes, for example, metal organic CVD (MOCVD), metal organic vapor phase epitaxy (MOVPE), plasma enhanced CVD (PECVD), remote plasma enhanced CVD (RP-CVD), molecular beam epitaxy (MBE), and hybrid vapor phase epitaxy (HVPE). In some embodiments, the first doped epitaxial layers 310 and 410 may be grown at a temperature higher than 1000 Celsius degrees, for example, 1050 Celsius degrees.

Growth directions of the first doped epitaxial layers 310 and 410 are associated with crystal orientation of the underlying crystal structure. With the triangular prisms 112 including the (111) facets are created, the final growth direction of first doped epitaxial layers 310 and 410 is <1-101>, which means that top surfaces 310TS and 410TS of the first doped epitaxial layers 310 and 410 extend along the (1-101) plane. Specifically, in some embodiments where the epitaxial layers 310 and 410 are GaN, initial growth of the GaN is mostly along the <0001> direction, rather than the <1-101> direction. That is, the growth rate along the <1-101> direction is negligible during the initial growth. After a long growth time, however, the (0001) facet disappears and the growth along the <1-101> direction is enhanced. As a result, the GaN is finally grown along the <1-101> direction, resulting in the top surfaces 310TS and 410TS extending along the (1-101) plane.

In some embodiments, the first doped epitaxial layer 310 is in-situ doped by an n-type dopant, such as, but not limited to, silicon, oxygen, or a combination thereof. In some embodiments, the first doped epitaxial layer 410 is in-situ doped by a p-type dopant, such as, but not limited to, magnesium, calcium, zinc, beryllium, carbon, and combinations thereof. The terms "in-situ doped" or "in-situ doping" in this context means that the epitaxial layers are doped during their epitaxy growth. In some other embodiments, the dopants can be implanted into the grown epitaxial layer, instead of in-situ doping. Since doping the GaN layers are performed prior to the subsequent patterning process of the GaN layers and formation of other epitaxial layers, the subsequently formed epitaxial layers will be free from the dopants carried over from the first doped epitaxial layers 310 and 410. In some embodiments, a nucleation layer (e.g., AlN) is optionally formed over the triangular prisms 112 prior to formation of the first doped epitaxial layers 310 and 410.

Figure 7:
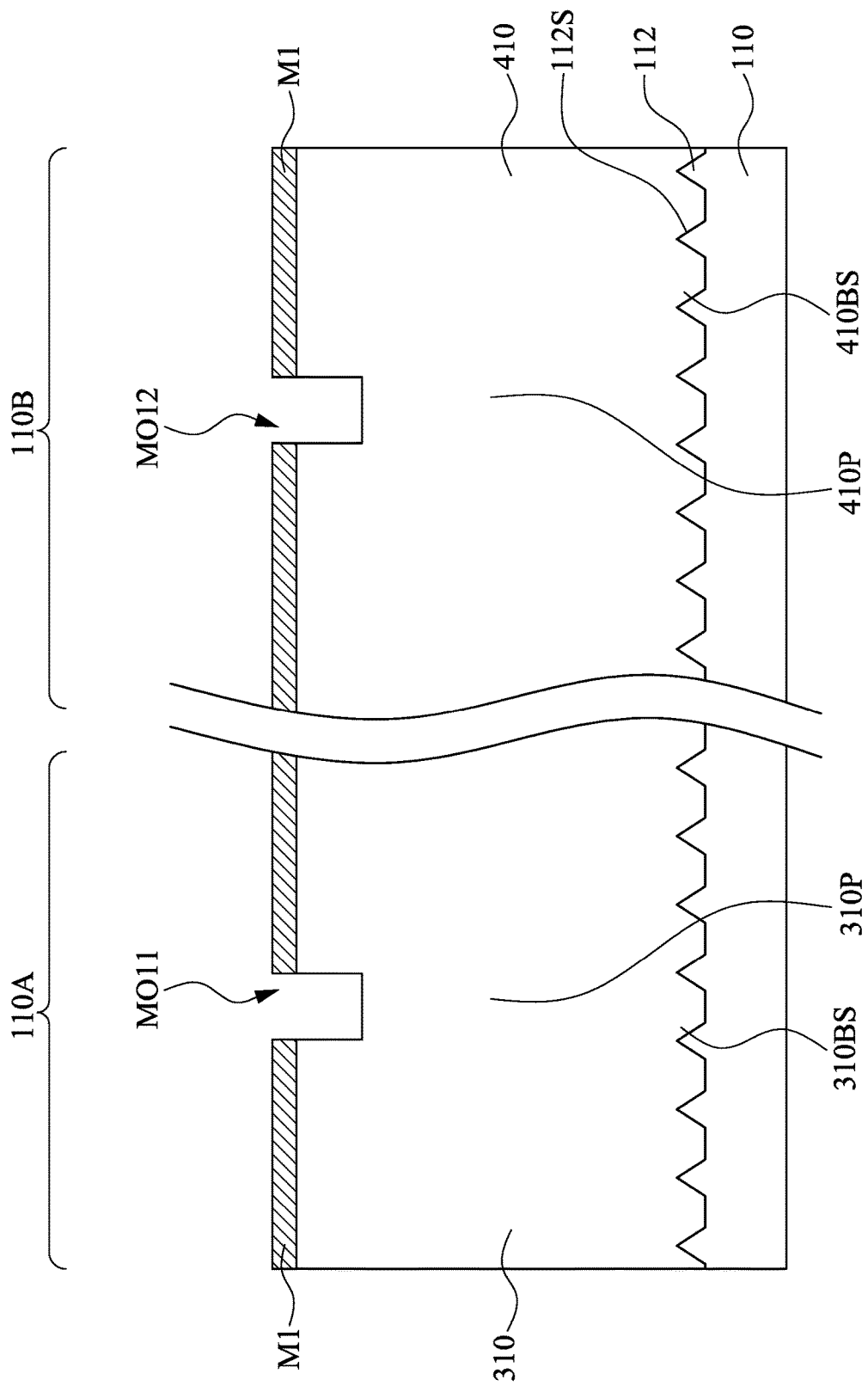

Returning to FIG. 3A, the method 200 proceeds to operation 206 where a patterned first mask layer M1 is formed over the first doped epitaxial layers 310 and 410, as illustrated in FIG. 7. The patterned first mask layer M1 is formed using suitable lithography and etching techniques, such that openings MO11 and MO12 are formed in the patterned first mask layer M1 to define positions where the TFETs are formed. Portions 310P and 410P of the first doped epitaxial layers 310 and 410 are exposed by the openings MO11 and MO12, respectively. The exposed portions 310P and 410P of the first doped epitaxial layers 310 and 410 may be recessed using, for example, an anisotropic etching method, while other portions of the first doped epitaxial layers 310 and 410 protected by the first mask layer M1 remain substantially intact.

Figure 8:
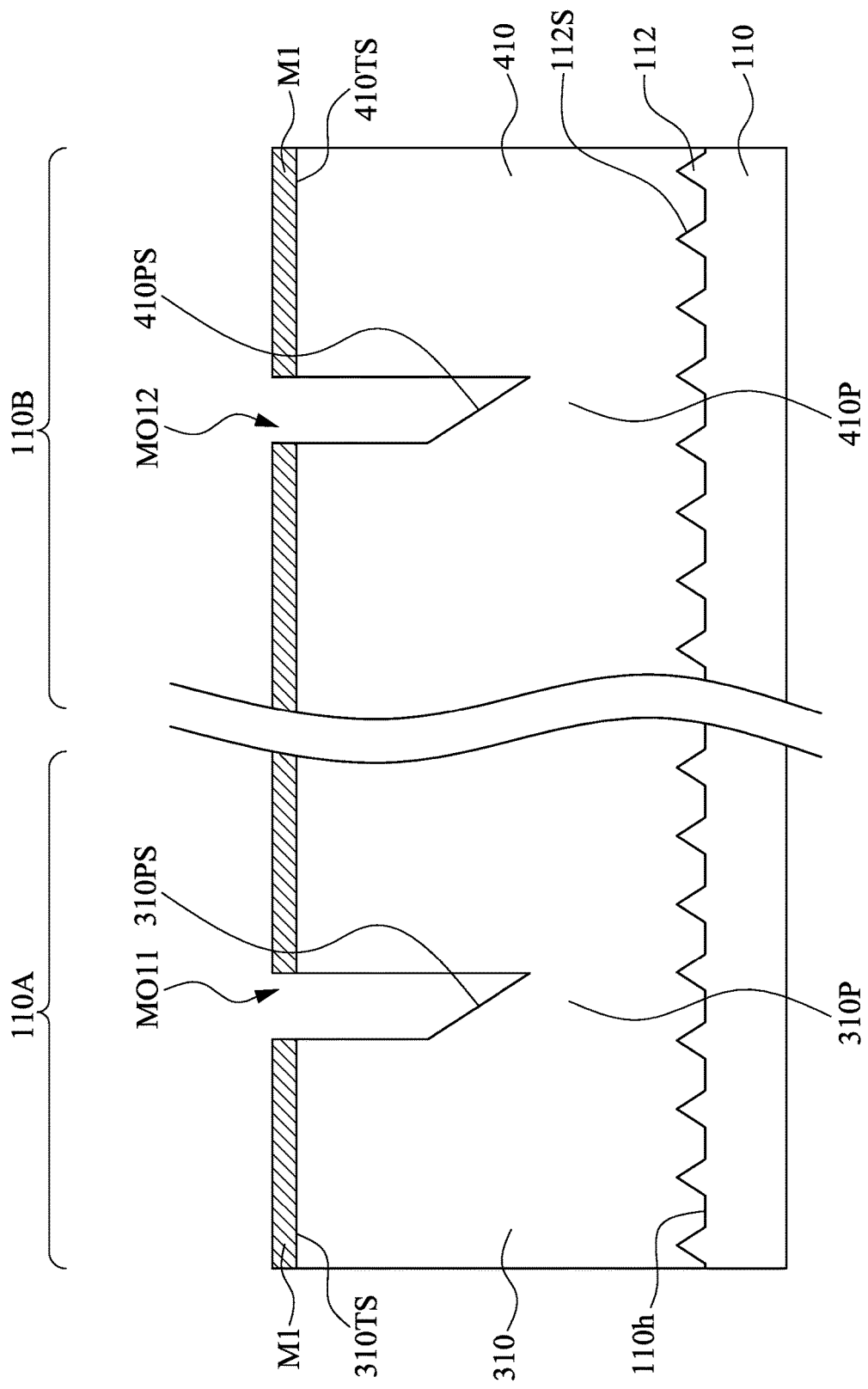

Returning to FIG. 3A, the method 200 proceeds to operation 208 where the exposed portions 310P and 410P of the first doped epitaxial layers 310 and 410 are etched to have polar facets 310PS and 410PS slanted with respect to the horizontal (001) surface 110h of the substrate 110, as illustrated in FIG. 8. For example, the polar facets 310PS and 410PS may have an angle with respect to the horizontal (001) surface 110h of the substrate 110, and the angle is in a range of 50 to 60 degrees. In some embodiments, the etching includes, for example, an anisotropic etching process using hydroxide solution (e.g., KOH) as the etchant. The etchant used herein has an etch rate selectivity greater than 1, in which etch rate selectivity is referred to as a ratio of a rate of etching a first crystal plane (e.g., the (1-101) plane) of the first doped epitaxial layers 310 and 410 to a rate of etching a second crystal plane (e.g., the (0001) plane) of the first doped epitaxial layers 310 and 410. In some embodiments where the first doped epitaxial layers 310 and 410 are GaN, the (1-101) plane is N-polar and can be selectively etched in the hydroxide solution, while the (0001) plane is Ga-polar and chemically stable in hydroxide solution. The chemically stability difference between (1-101) and (0001) planes of GaN in hydroxide solution contributes to etch selectivity between the (1-101) and (0001) planes of GaN, and the resulting facets 310PS and 410PS of the GaN thus extend along (0001) plane, which is a polar plane that enables the interband tunneling, as discussed above.

Specifically, on the (0001) Ga-polar facet (e.g., the facets 310PS and 410PS), the surface may be converted into N-terminated with three electronegative dangling bonds when a first Ga layer is removed by OH$^-$ ions in the hydroxide solution. Because of a repulsive force between the three electronegative dangling bonds and the OH$^-$ ions, the OH$^-$ ions are unable to access the surface. For this reason, the (0001) Ga-polar facet is resistant to the wet etching in the hydroxide solution. In contrast, there is a single electronegative dangling bond of N-atom on the (1-101) N-polar facet, which is easily accessible to OH$^-$ ions. Therefore, the OH$^-$ ions can react with GaN continually and form gallium oxide, which can be dissolved in the hydroxide solution. As a result, the hydroxide solution can selectively etch the (1-101) N-polar facet while leave the (0001) G-polar facet substantially intact, thereby resulting in facets 310PS and 410PS extending along and oriented in the (0001) plane. Moreover, the facets 310PS and 410 PS are slanted with respect to the top surfaces 310TS and 410TS of the first doped epitaxial layers 310 and 410, because the top surfaces 310TS and 410TS extend along the (1-101) plane, rather than the (0001) plane.

The etchant used herein is different from the etchant used in FIG. 7. To be specific, the difference between the etching rates of different crystal surfaces (e.g. (1-101) and (0001) facets) in the etching process of FIG. 8 is greater than that in the etching process of FIG. 7.

Figure 9:
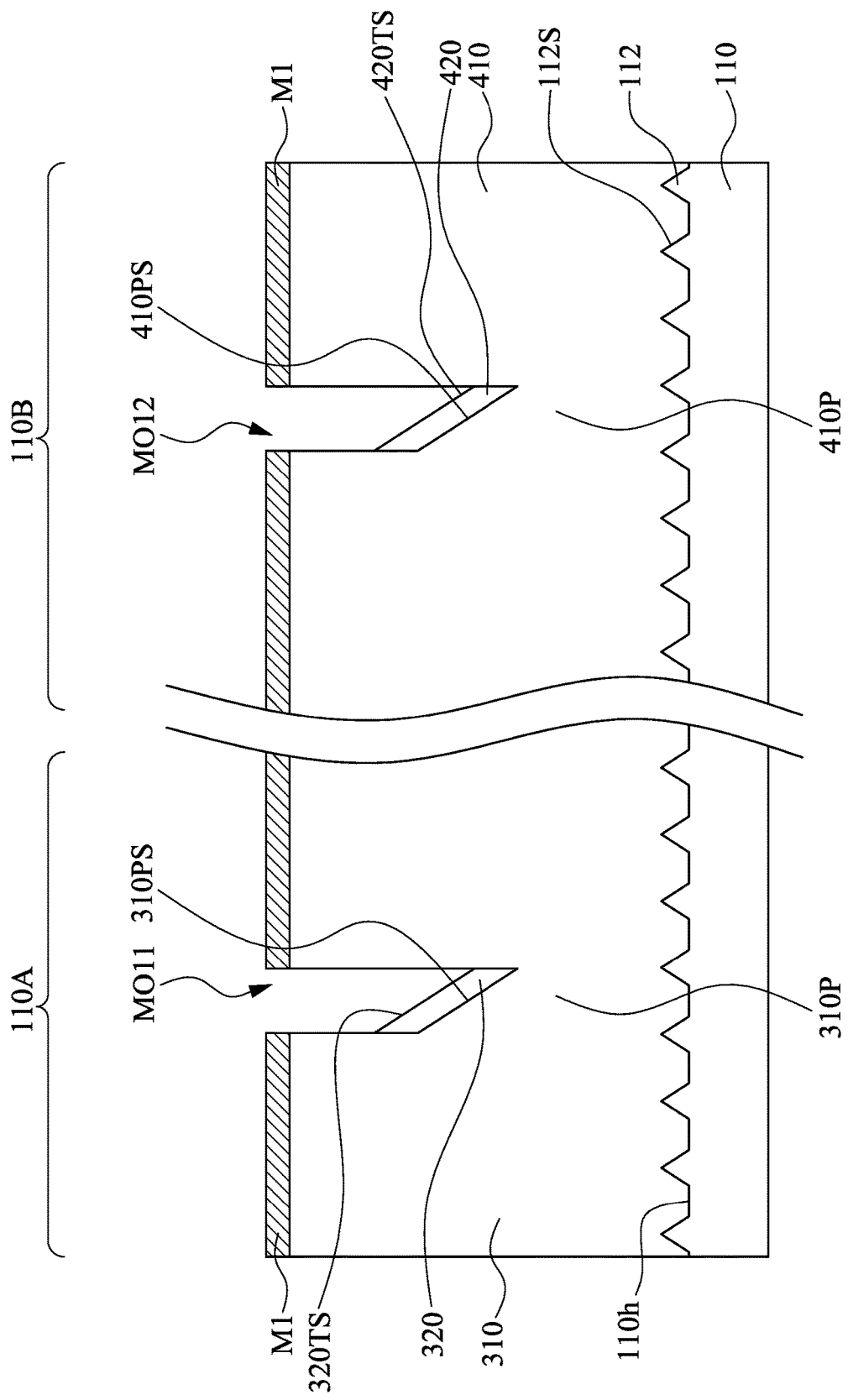

Returning to FIG. 3A, the method 200 then proceeds to operation 210 where interlayers 320 and 420 are epitaxially grown over the polar facets 310PS and 410PS, respectively, as illustrated in FIG. 9. In some embodiments, the interlayer 320 and 420 are made of III-nitride material(s) different from the binary GaN compound of the first doped epitaxial layers 310 and 410. For example, the interlayers 320 and 420 are $In_xGa_{1-x}N$, wherein "x" is in a range from about 0.1 to about 1. In further embodiments, the interlayers 320 and 420 are a binary indium nitride (InN) compound free from gallium. The difference in composition or material results in the interlayers 320 and 420 having a lattice constant different from that of the first doped epitaxial layers 310 and 410, so as to induce strain in the first doped epitaxial layers 310 and 410. The strains would result in improved piezoelectric polarization at the polar facets 310PS and 410PS, which in turn will be advantageous for interband tunneling.

In some embodiments where the interlayers 320 and 420 are $In_xGa_{1-x}N$, the growth rate of the $In_xGa_{1-x}N$ in the <0001> direction may be an order of magnitude faster than that in the <1-101> direction. Therefore, the resulting facets 320TS and 420 TS of the interlayers 320 and 420 may extend along the (0001) plane, which resulting in facets 320TS and 420TS of the interlayer 320 substantially parallel with the facets 310PS and 420 PS, respectively.

In some embodiments, a thickness of the interlayers 320 and 420 is in a range of about 1 nm to about 3 nm, for example, a range of about 1.4 nm to about 2.4 nm. If the thickness of the interlayer is greater than 3 nm, the on-current may be unsatisfactory for the TFETs because of an increased tunneling distance. In some embodiments, the interlayers 320 and 420 are not intentionally doped (NID), for example, not having intentionally placed dopants, but rather having a doping resulting from process contaminants. For example, the interlayers 320 and 420 are free from the dopants in the first doped epitaxial layers 310 and 410. In some embodiments, the interlayers 320 and 420 may be formed by a suitable deposition process, such as chemical vapor deposition (CVD), low pressure CVD (LPCVD), atmospheric pressure CVD (APCVD), ultrahigh vacuum CVD (UHVCVD), atomic layer deposition (ALD), molecular layer deposition (MLD), plasma enhanced CVD (PECVD), metal-organic CVD (MOCVD), molecular beam epitaxy (MBE), sputter deposition, the like, or combinations thereof.

In some embodiments, the interlayers 320 and 420 may be grown at a temperature lower than that of the growth of the first doped epitaxial layers 310 and 410. For example, the interlayers 320 and 420 may be grown at a temperature of 700 to 800 Celsius degrees, for example, 750 Celsius degrees, which is lower than the growth temperature of the first doped epitaxial layers 310 and 410 (e.g. 1050 Celsius degrees). Since growing $In_xGa_{1-x}N$ and growing GaN are intervened at least by operations 206 and 208 of the method 200, a cooling treatment for intentionally lowering the temperature from growing GaN to growing $In_xGa_{1-x}N$ can be omitted, which is advantageous to prevent unwanted contamination resulting from the cooling treatment.

Figure 10:
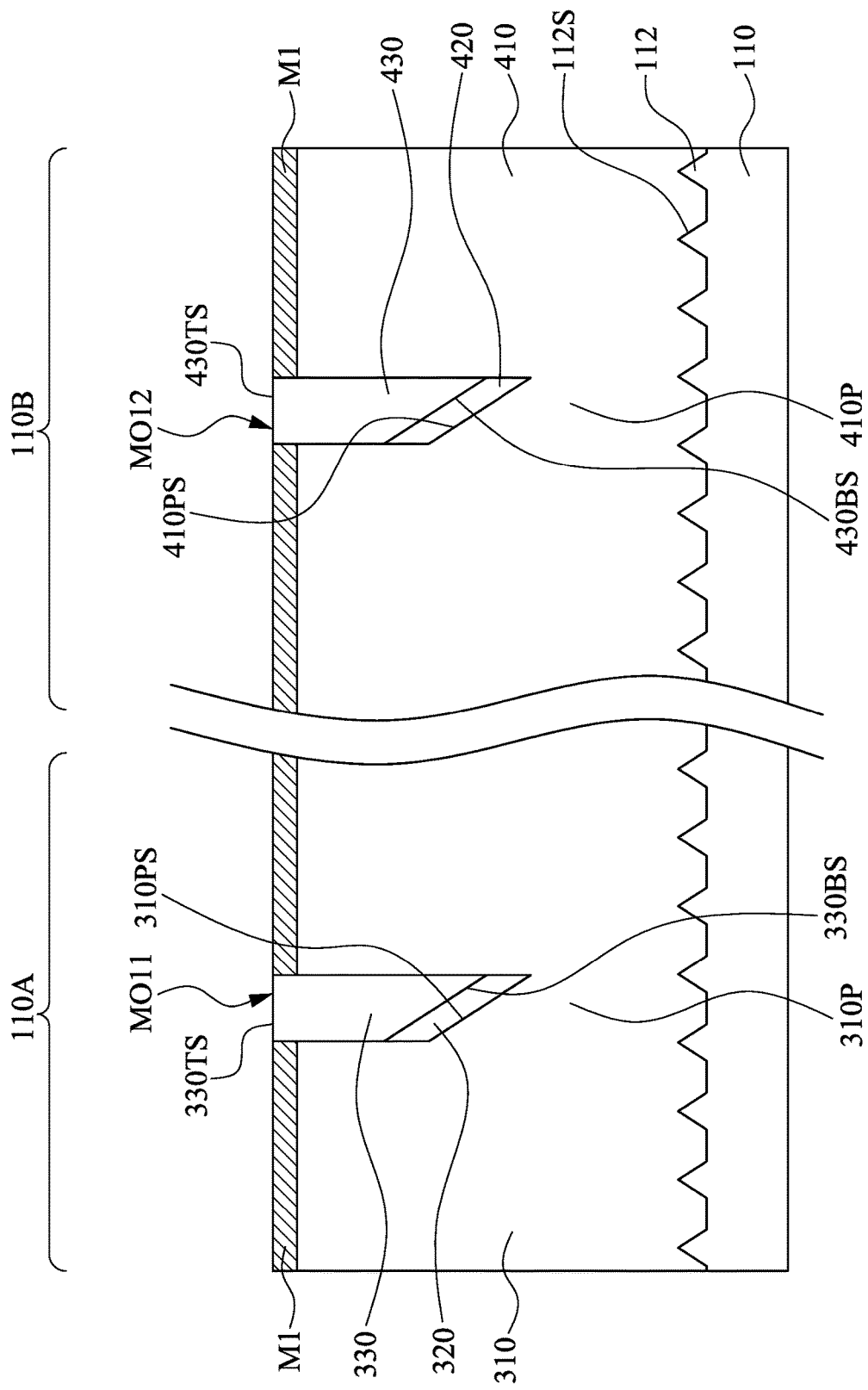

Returning to FIG. 3A, the method 200 proceeds to operation 212 where second doped epitaxial layers 330 and 430 are epitaxially grown over the interlayers 320 and 420, respectively, as illustrated in FIG. 10. The second doped epitaxial layers 330 and 430 are III-N compound semiconductor layers including a material selected from GaN, InN, AlN, $In_xGa_{(1-x)}N$, $Al_xGa_{(1-x)}N$, $Al_xIn_yGa_{(1-x-y)}N$, the like, and combinations thereof, "x" is in a range of 0 to 1, and "y" is in a range of 0 to 1. For example, the second doped epitaxial layers 330 and 430 are made of a binary GaN compound, which is the same as the material of the first doped epitaxial layers 310 and 410.

Initial growth of the GaN is mostly along the <0001> direction, rather than the <1-101> direction, thereby resulting in (0001) facets of second doped epitaxial layers 330 and 430. Afterwards, the (0001) facets disappear and the growth along the <1-101> is enhanced, and the resulting top surfaces 330TS and 430TS of second doped epitaxial layers 330 and 430 thus extend along the (1-101) plane, as illustrated in FIG. 10. Excess materials of the second doped epitaxial layers 330 and 430 over the mask layer M1 may be removed using, for example, a CMP process.

The second doped epitaxial layers 330 and 430 have bottom facets 330BS and 430BS respectively in contact with the interlayers 320 and 420. The bottom facets 330BS and 430BS are initially grown from the (0001) facets 320TS and 420TS, and thus extend along the (0001) plane as well. In some embodiments where the second doped epitaxial layers 330 and 430 are GaN, the (0001) plane is a polar plane that enables the interband tunneling, as discussed above. The (0001) facets 330BS and 430BS are slanted with respect to a (001) surface of the substrate 110, as illustrated in FIG. 10.

The indium-free GaN of the second doped epitaxial layers 330 and 430 are different from $In_xGa_{1-x}N$ of the interlayers 320 and 420. The difference in composition or material results in the interlayers 320 and 420 having a lattice constant different from that of the second doped epitaxial layers 330 and 430, so as to induce strain in the second doped epitaxial layers 330 and 430. The strains would result in piezoelectric polarization at the bottom facets 330BS and 430BS, which in turn will be advantageous for interband tunneling.

In some embodiments, a thickness of the second doped epitaxial layer 330 and 430 may be in a range from about 2 nm to about 5 nm. The second doped epitaxial layer 330 and 430 are thick enough to provide low dislocation density ($<10^8$ cm') of the subsequently grown layers for high yield of working devices. Formation method of the III-N compound semiconductor layers includes, for example, metal organic CVD (MOCVD), metal organic vapor phase epitaxy (MOVPE), plasma enhanced CVD (PECVD), remote plasma enhanced CVD (RP-CVD), molecular beam epitaxy (MBE), and hybrid vapor phase epitaxy (HVPE).

In some embodiments, the first doped epitaxial layer 310 and the second doped epitaxial layer 330 are of different conductivity types. For example, the second doped epitaxial layer 330 is doped by a p-type dopant, such as, but not limited to, magnesium, calcium, zinc, beryllium, carbon, and combinations thereof. In some embodiments, the first doped epitaxial layer 410 and the second doped epitaxial layer 430 are of different conductivity types. For example, the second doped epitaxial layer 430 is doped by an n-type dopant, such as, but not limited to, silicon, oxygen, or a combination thereof.

Figure 11:
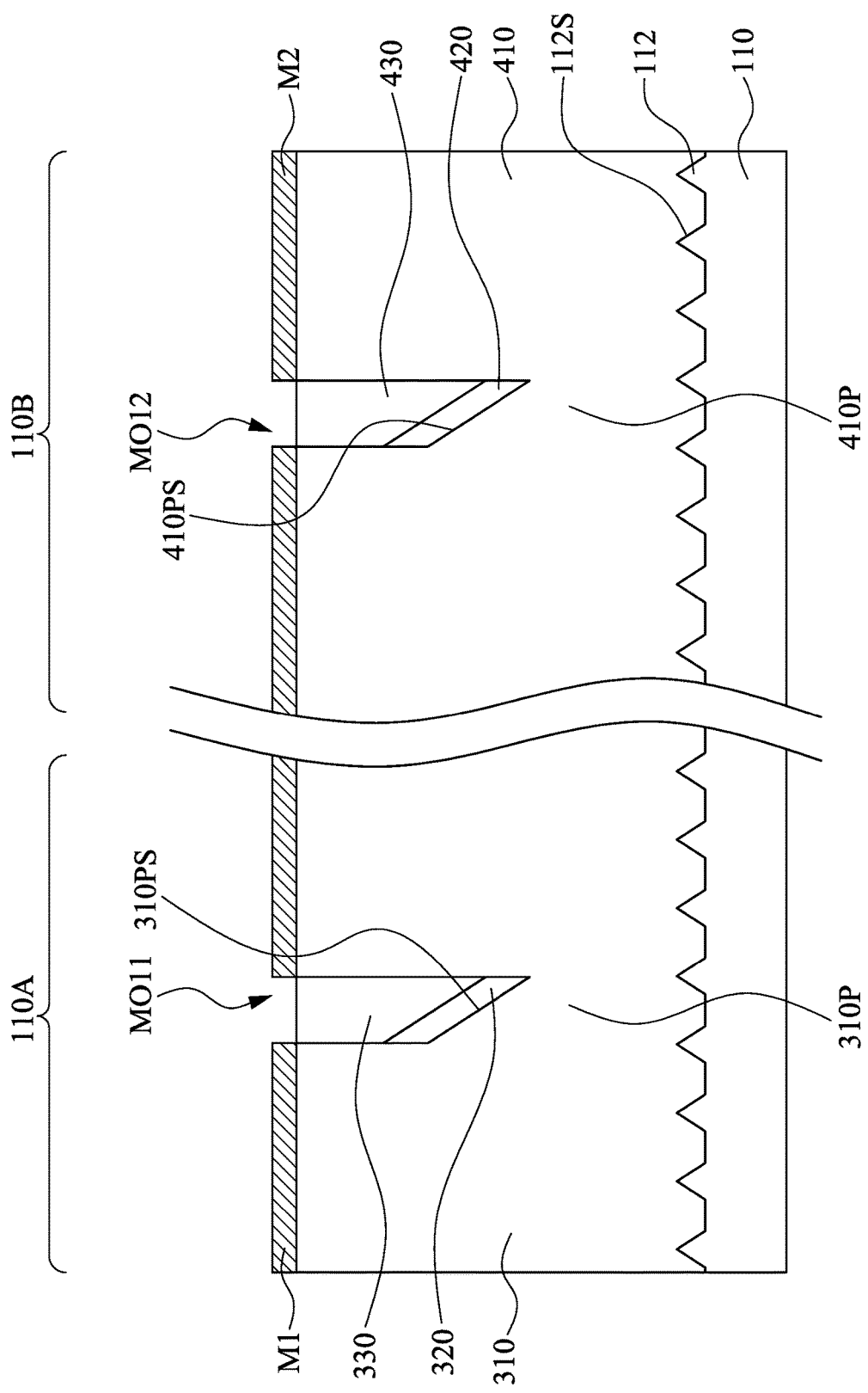

Returning to FIG. 3A, the method 200 proceeds to operation 214 where portions of the second doped epitaxial layers 330 and 430 in the openings MO11 and MO12 of the patterned first mask layer M1 are removed, as illustrated in FIG. 11. The removal may include performing an anisotropic etching process, in which the first mask layer M 1 has a higher etch resistance than that of the second doped epitaxial layers 330 and 430. The etchant used herein is different from the etchant used in FIG. 8. To be specific, the difference between the etching rates of different crystal surfaces (e.g. (1-101) and (0001) crystal surfaces) in the etching process of FIG. 11 is less than that in the etching process of FIG. 8.

Figure 12:
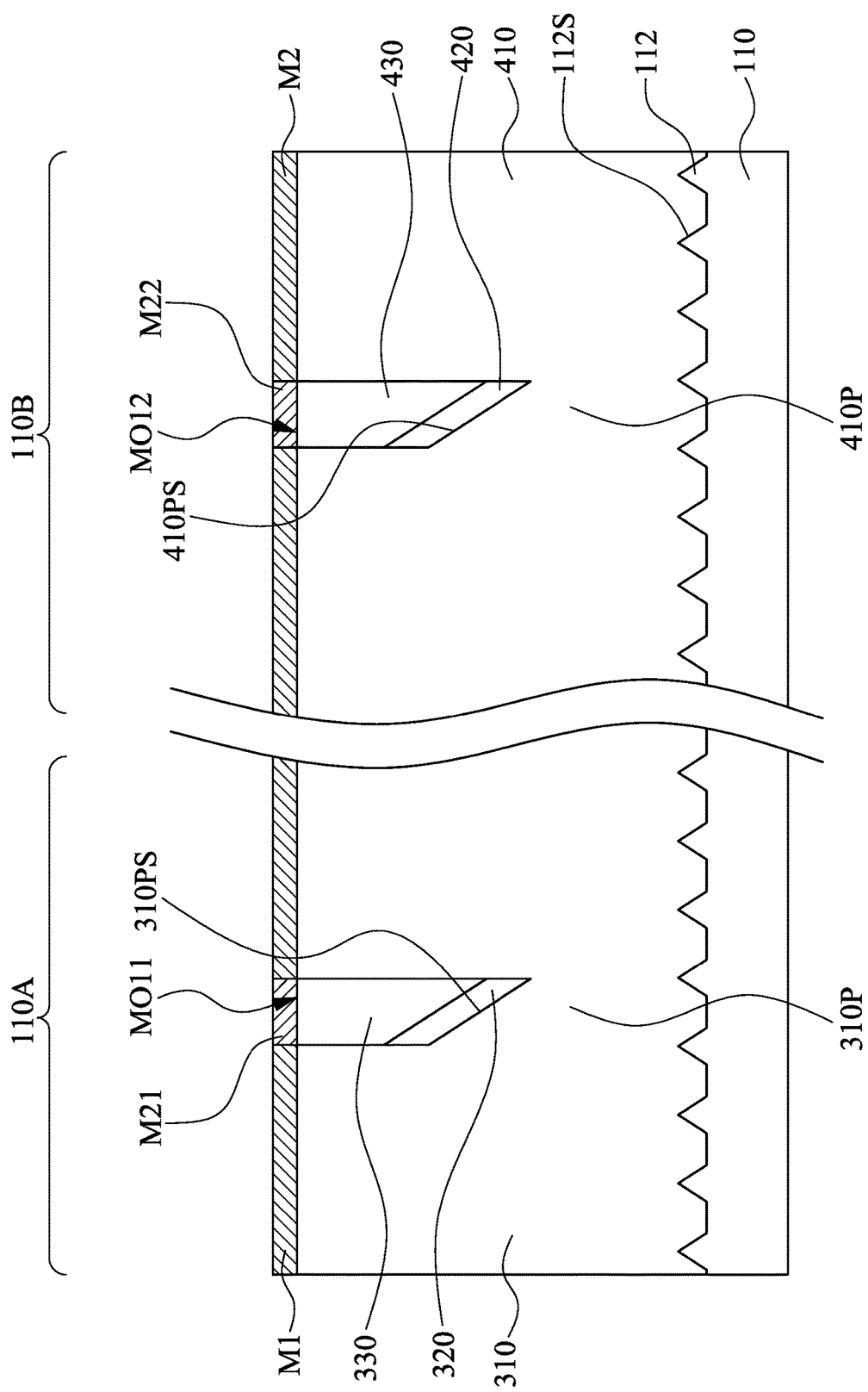

Returning to FIG. 3A, the method 200 proceeds to operation 216 where second masks M21 and M22 are formed in the openings MO11 and MO12 over the second doped epitaxial layers 330 and 430, as illustrated in FIG. 12. An example formation method of the second masks M21 and M22 includes blanket depositing a mask layer over the structure as illustrated in FIG. 11, followed by removing an excess material of the mask layer outside the openings MO11 and MO12, which in turn results in the second masks M21 and M22 self-aligned with the second doped epitaxial layers 330 and 430. The second masks M21 and M22 are made of a material different from that of the first mask layer M1, and thus have an etch selectivity different from that of the first mask layer M1.

Figure 13:
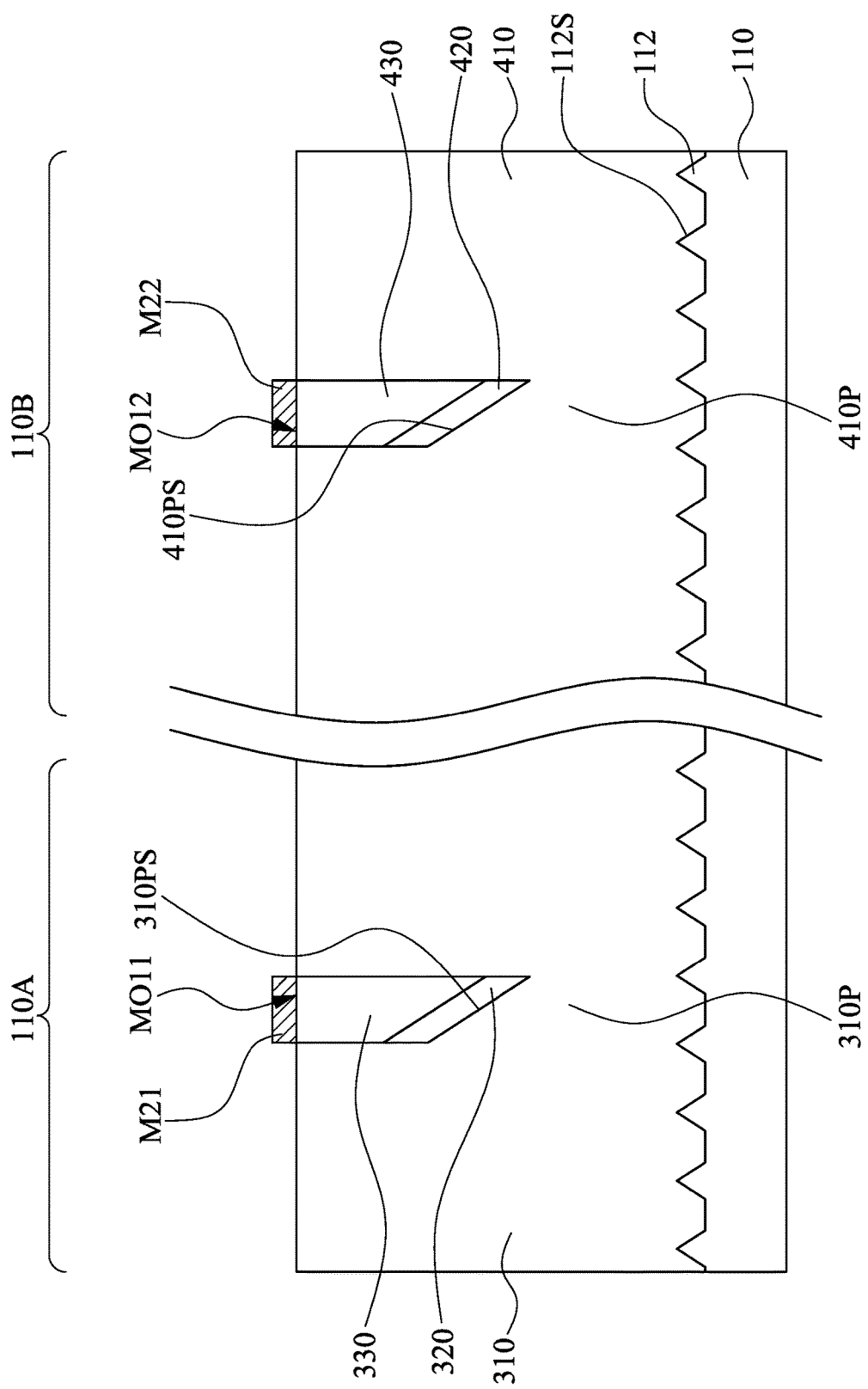

Returning to FIG. 3B, the method 200 proceeds to operation 218 where the first mask layers M11 and M12 are removed, as illustrated in FIG. 13. The removal may include an etch process. The second masks M21 and M22 have a higher etch resistance to the etch process than that of the first mask layer M1, such that the second masks M21 and M22 remains covering the underlying materials (e.g., the second doped epitaxial layers 330 and 430 and the underlying interlayers 320 and 420), while the first mask layer M1 is removed. The second masks M21 and M22 thus define positions where the TFETs are formed.

Figure 14:
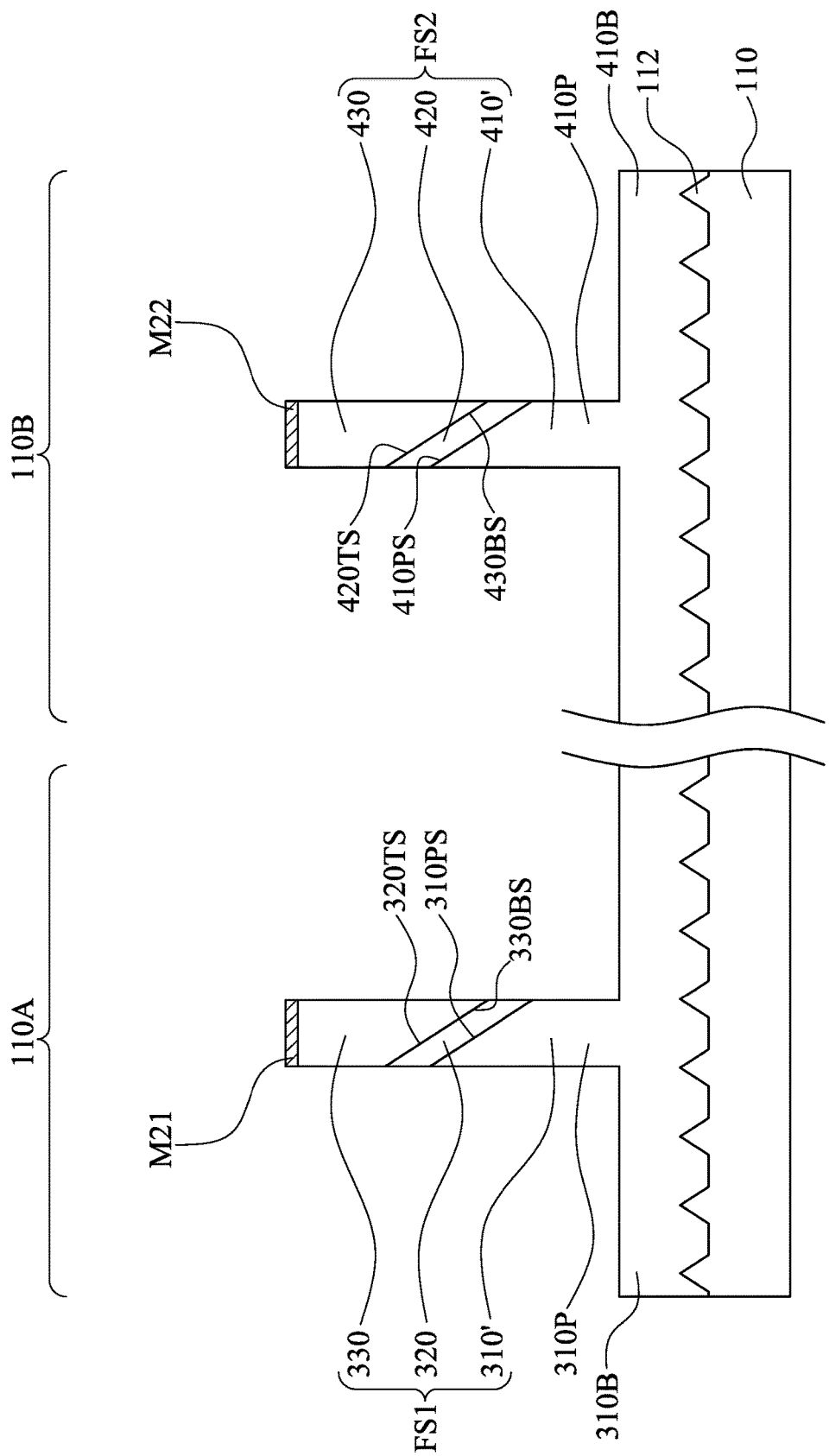

Returning to FIG. 3B, the method 200 proceeds to operation 220 where materials uncovered by the second masks M21 and M22 are etched to form fin structures FS1 and FS2, as illustrated in FIG. 14. Operation 220 can be performed using, for example, an anisotropic etching process. A position of the mask M21 contributes to the etching direction self-aligned with a $GaN/In_xGa_{(1-x)}N/GaN$ heterojuction stack of layers 310', 320 and 330. Similarly, the position of the mask M22 contributes to the etching direction self-aligned with a $GaN/In_xGa_{(1-x)}N/GaN$ heterojuction stack of layers 410', 420 and 430.

Therefore, the resulting fin structure FS1 includes the $GaN/In_xGa_{(1-x)}N/GaN$ heterojuction stack of the n-type first doped epitaxial layer 310', the interlayer 320, and the p-type second epitaxial layer 330. The fin structure FS1 can be thus used for a p-type TFET. The n-type first doped epitaxial layers 310' and the p-type second epitaxial layer 330 can be respectively referred to as an n-type source-layer and a p-type drain-layer of the p-type TFET. The fin structure FS2 includes the $GaN/In_xGa_{(1-x)}N/GaN$ heterojuction stack of the p-type first doped epitaxial layers 410', the interlayer 420, and the n-type second epitaxial layer 430. The fin structure FS2 can be thus used for an n-type TFET. The p-type first doped epitaxial layers 410' and the n-type second epitaxial layer 430 can be respectively referred to as a p-type source-layer and an n-type drain-layer of the n-type TFET.

Herein, the first doped epitaxial layers 310 and 410 have bottom portions 310B and 410B and protruding portions 310P and 410P, respectively, and the protruding portions 310P and 410P are aligned with the layers 320 and 330 and layers 420 and 430, respectively. The protruding portions 310P and 410P taper away from the substrate 110 and toward the second doped epitaxial layers 330 and 430, respectively. The second doped epitaxial layers 330 and 430 taper toward the substrate 110. The interlayers 320 and 420 are respectively between tapered surfaces (i.e. the facets 310PS and 410PS) of the protruding portions 310P and 410P and tapered surfaces (i.e. the facets 330BS and 430BS) of the second doped epitaxial layers 330 and 430.

Herein, the fin structures FS1 and FS2 have longitude axes LA (referring to FIG. 2A), and the slanted surfaces (i.e., the facets 310PS, 410PS, 320TS, 420TS, 330BS, and 430BS) are parallel with the longitude axes. In these cross-sectional views, slanted direction of the interlayers 320 and 420 is perpendicular to the longitude axis.

Figure 15:
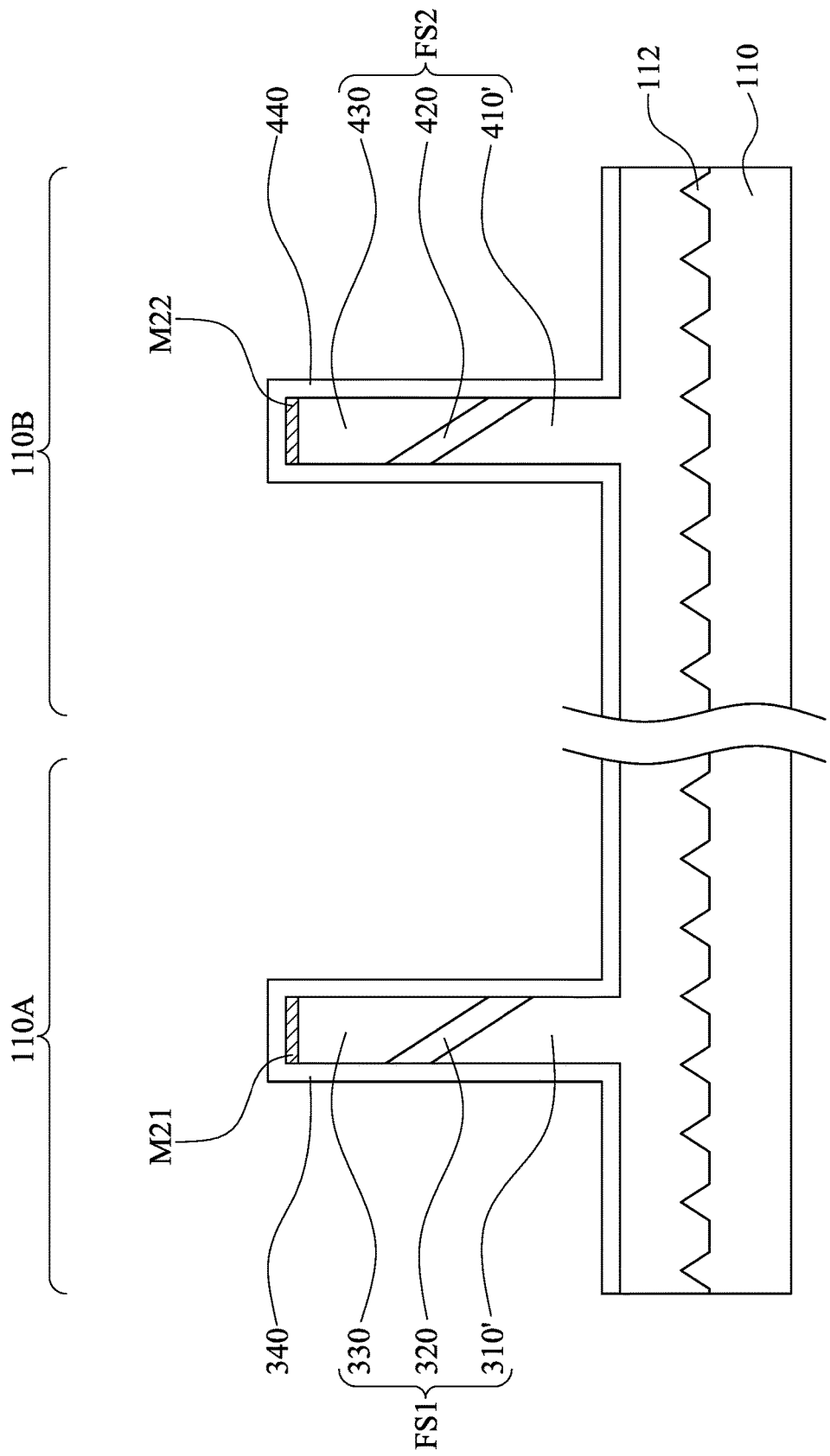

Returning to FIG. 3B, the method 200 proceeds to operation 222 where gate dielectric layers 340 and 440 are formed around the fin structures FS1 and FS2, respectively. The resulting structure is illustrated in FIG. 15. The gate dielectric layers 340 and 440 are formed by, for example, atomic layer deposition (ALD), chemical vapor deposition (CVD), metal organic CVD (MOCVD), physical vapor deposition (PVD), thermal oxidation, or combinations thereof. The gate dielectric layers 340 and 440 are made of high-k dielectric. The gate dielectric layers 340 and 440 are, for example, a binary or ternary high-k film, such as HfO, LaO, AlO, ZrO, TiO, $Ta_2O_5$, $Y_2O_3$, STO, BTO, BaZrO, HfZrO, HfLaO, HfTaO, HfTiO, the like, or combinations thereof. In some embodiments, the gate dielectric layers 340 and 440 are formed of the same material. Alternatively, the gate dielectric layers 340 and 440 are formed of different materials. The different materials between gate dielectric layers 340 and 440 can be achieved by suitable deposition, lithography and/or etching processes. In some embodiments, a lower portion of the gate dielectric layer 340 surrounding the n-doped GaN layer 310' has a different dielectric material than an upper portion of the gate dielectric layer 340 surrounding the p-doped GaN layer 330. Similarly, a lower portion of the gate dielectric layer 440 surrounding the p-doped GaN layer 410' has a different dielectric material than an upper portion of the gate dielectric layer 440 surrounding the n-doped GaN layer 430. The different materials between portions of a gate dielectric layer can be achieved by suitable deposition, lithography and/or etching processes.

Figure 16:
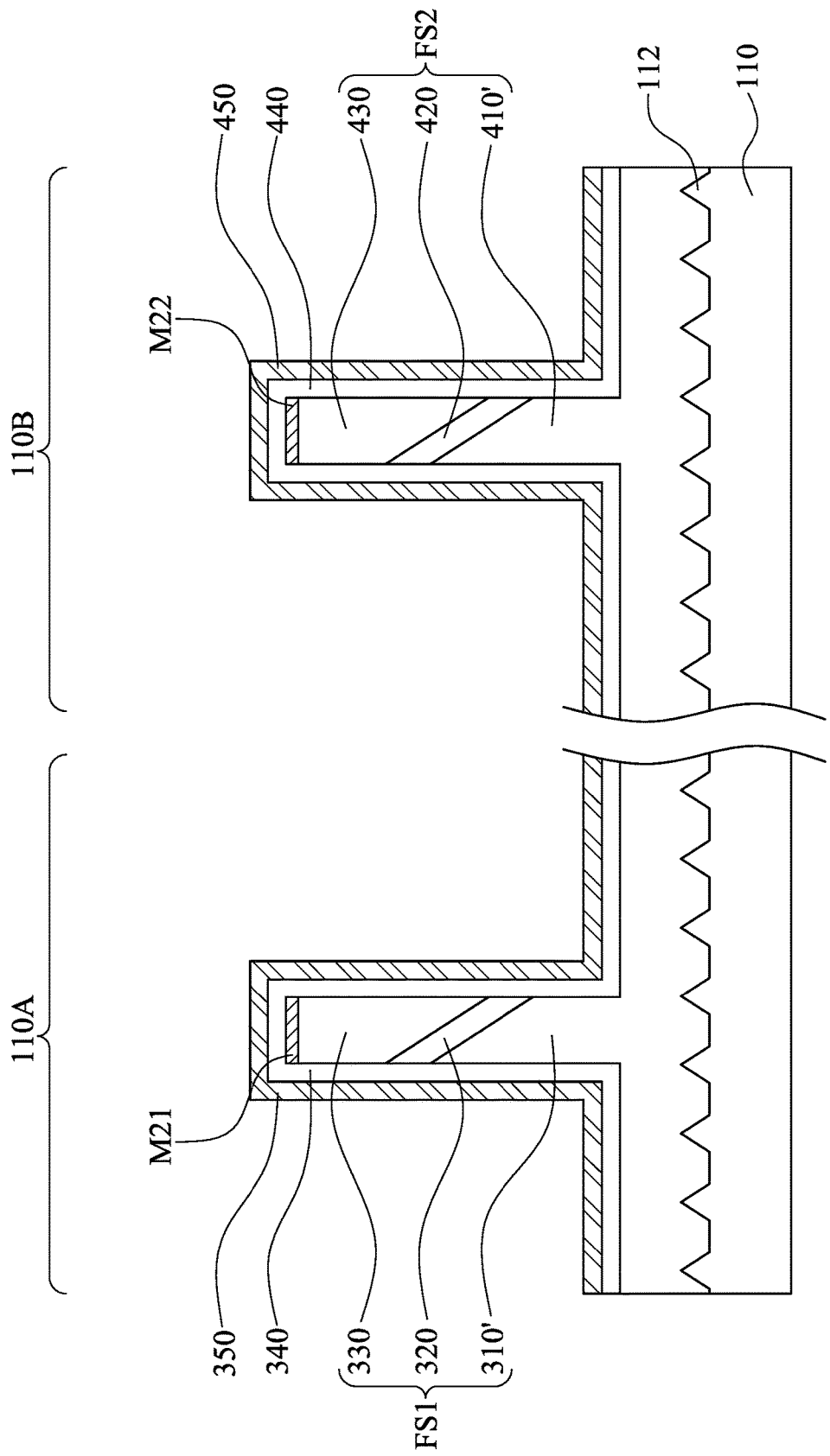

Returning to FIG. 16, the method 200 proceeds to an operation 224 where metal gate layers 350 and 450 are formed around the fin structures FS1 and FS2 and the gate dielectric layers 340 and 440, respectively. The resulting structure is illustrated in FIG. 16.

In some embodiments, the metal gate layer 350 is blanket formed over the gate dielectric layer 340 over the first region 110A for forming a p-type TFET. The metal gate layer 450 is blanket formed over the gate dielectric layer 440 over the second region 110B for forming an n-type TFET. In some embodiments, the metal gate layers 350 and 450 include the same metal. In some other embodiments, the metal gate layers 350 and 450 include different metals. For example, the metal gate layers 350 and 450 may include different work function metals to provide suitable work functions for the p-type and n-type TFETs, respectively. Example materials of the metal gate layers 350 and 450 include tungsten, titanium nitride, the like or combinations thereof. The metal gate layers 350 and 450 are deposited by ALD, sputter or other processes.

Figure 17:
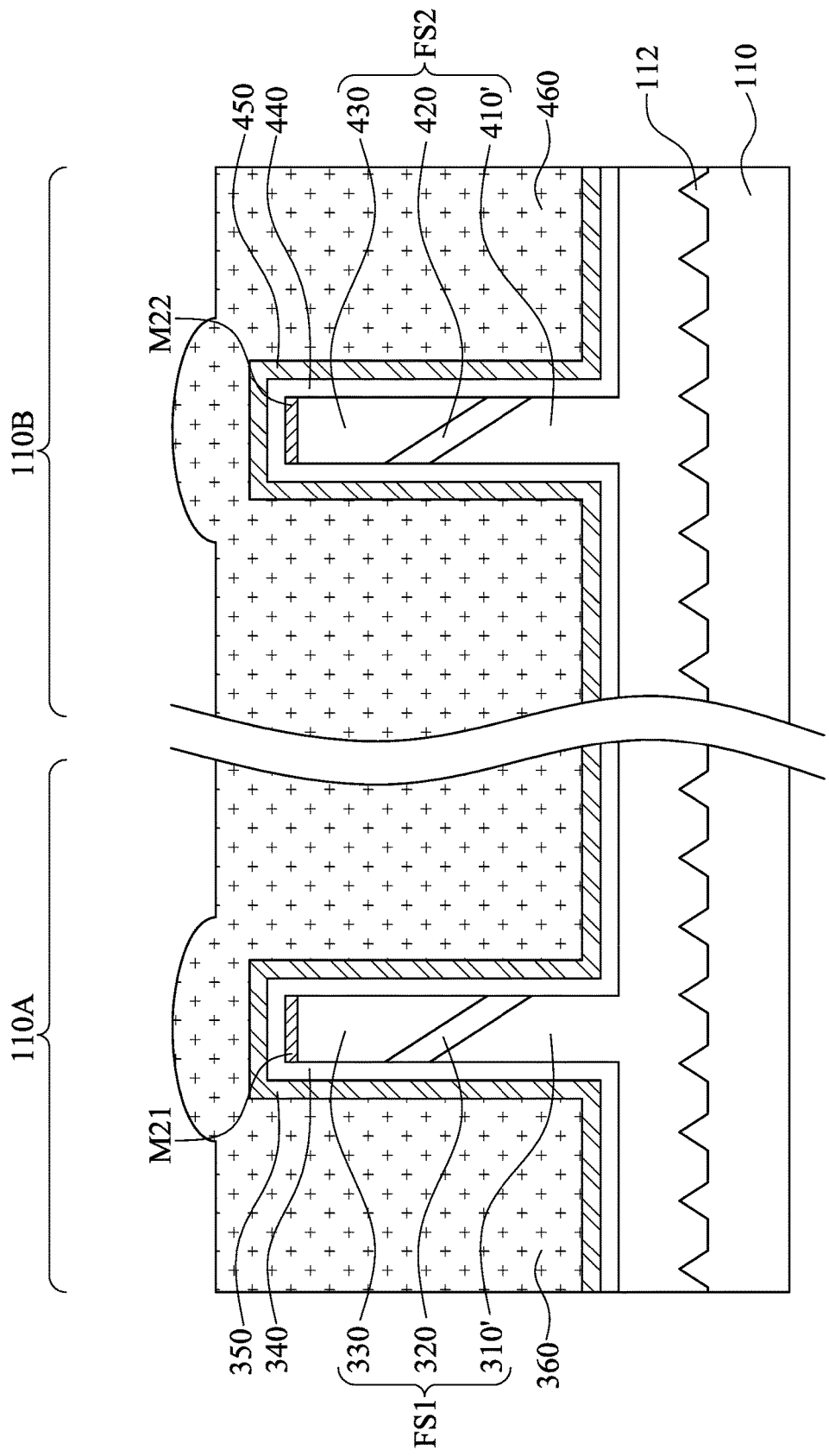

Returning to FIG. 3B, the method 200 proceeds to operation 226 where fill metal layers 360 and 460 are formed over the metal gate layers 350 and 450, respectively. The resulting structure is illustrated in FIG. 17. The fill metal layers 360 and 460 include, for example, W, Co, Al, Cu, the like, or combinations thereof. In some embodiments, the fill metal layers 360 and 460 are formed of the same material. Alternatively, the fill metal layers 360 and 460 are formed of different materials.

Figure 18:
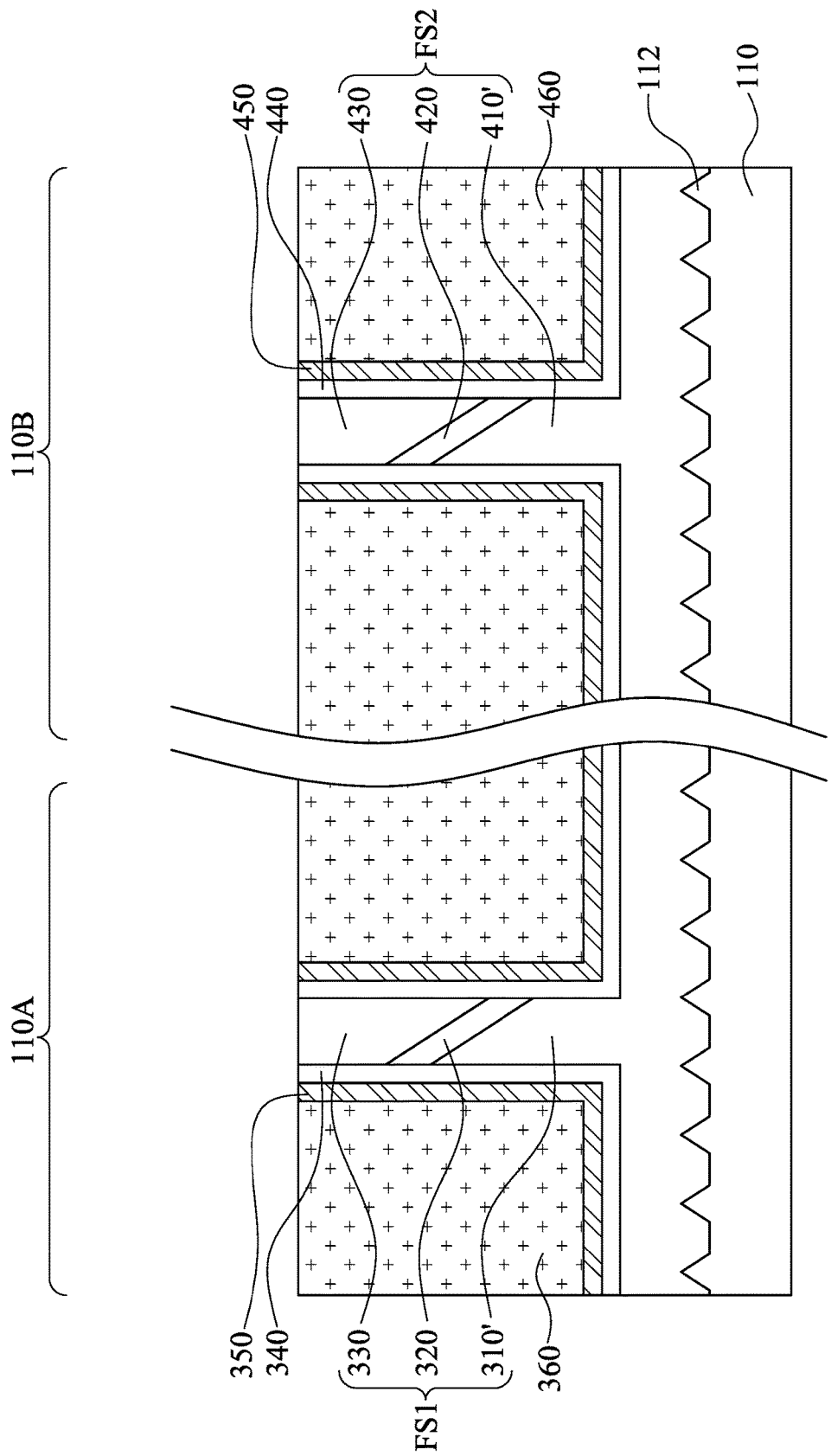

Returning to FIG. 3B, the method 200 proceeds to operation 228 where a chemical mechanical polish (CMP) process is performed to planarize the fill metal layers 360 and 460 until the fin structures FS1 and FS2 are exposed. The resulting structure is illustrated in FIG. 18. In some embodiments, the CMP process results in the top surface of the fill metal layer 360 substantially level with the top surface of the second doped epitaxial layer 330. Similarly, the CMP process results in the top surface of the fill metal layer 460 substantially level with the top surface of the second doped epitaxial layer 430.

Figure 19:
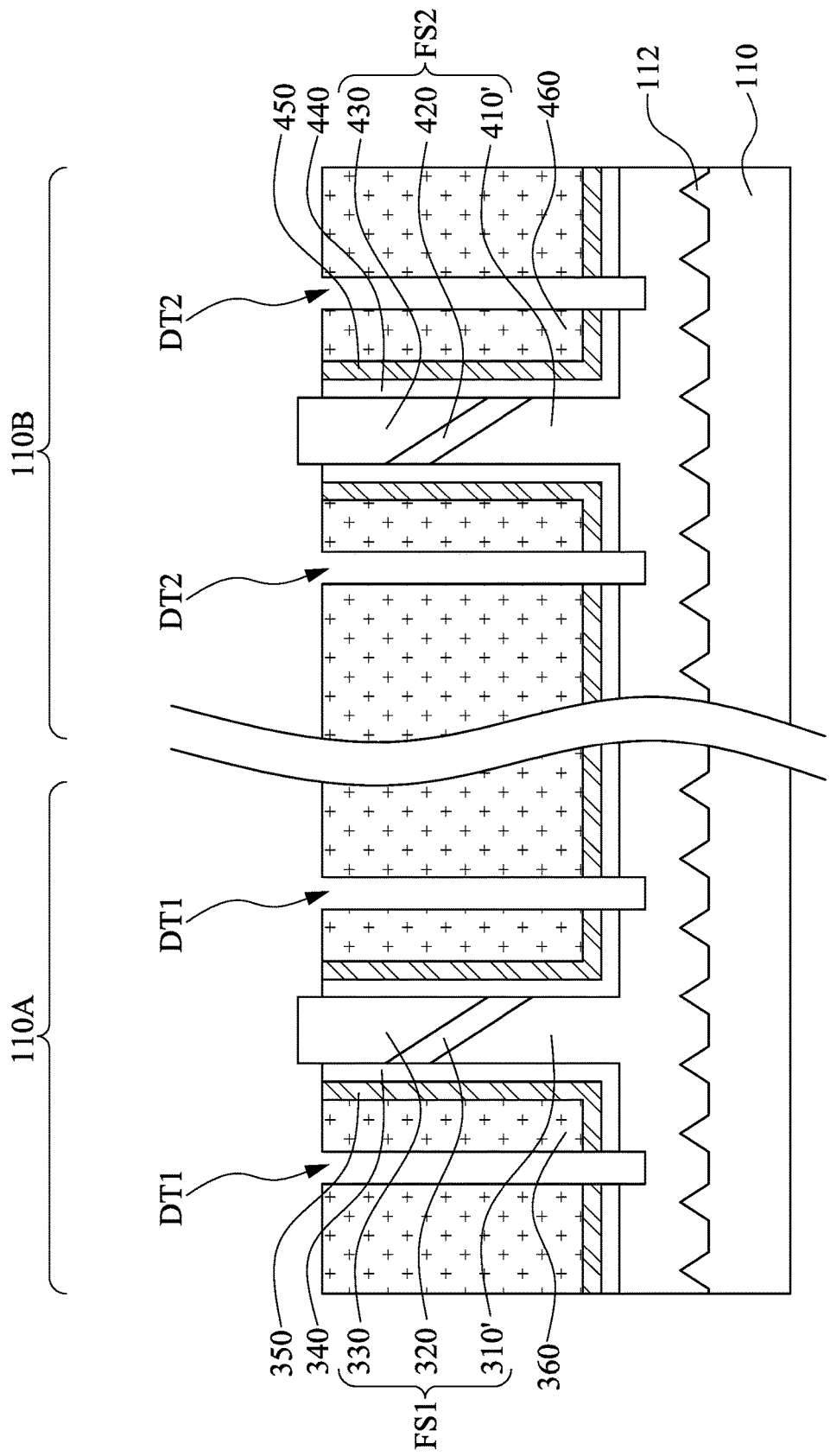

Returning to FIG. 3B, the method 200 proceeds to an operation 230 where trenches DT1 and DT2 are formed in the fill metal layers 360 and 460, as illustrated in FIG. 19. The trenches DT1 and DT2 may further extend through the gate dielectric layers 340 and 440 and the metal gate layers 350 and 450 to the first doped epitaxial layers 310' and 410', respectively.

The trenches DT1 and DT2 may be formed using suitable etching techniques, such as wet etching, dry etching or combinations thereof. In some embodiments, the etching process results in top surfaces of the fill metal layer 360, the metal gate layer 350, and the gate dielectric layer 340 lower than top surfaces of the second doped epitaxial layer 330. Similarly, the etching process results in top surfaces of the fill metal layer 460, the metal gate layer 450, and the gate dielectric layer 440 are lower than top surfaces of the second doped epitaxial layer 430. That is, the gate dielectric layers 340 and 440, the metal gate layers 350 and 450, and the fill metal layers 360 and 460 are further pulled back, such that the fin structures FS1 and FS2 protrudes from the gate dielectric layers 340 and 440, the metal gate layers 350 and 450, and the fill metal layers 360 and 460.

Figure 20:
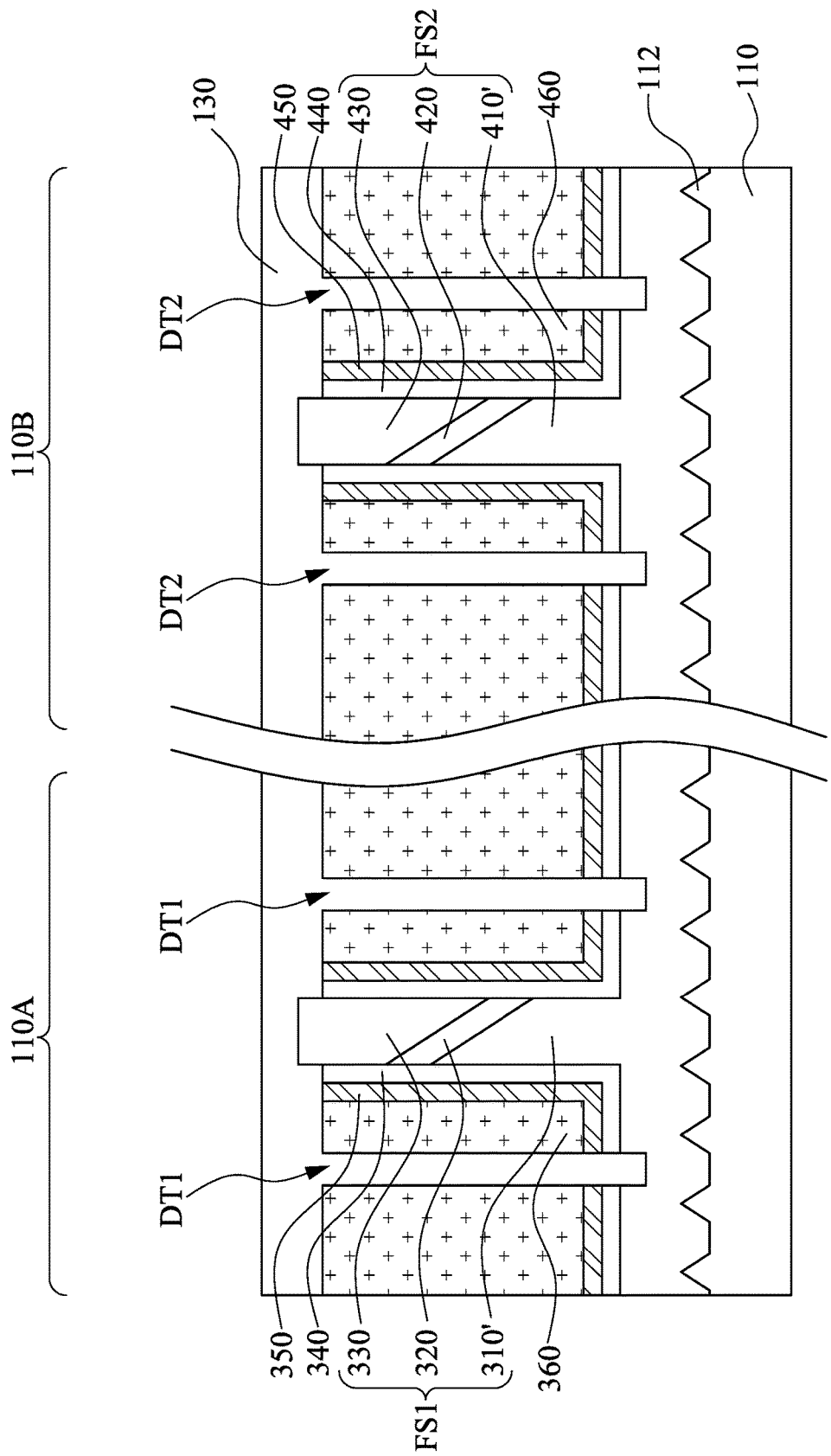

Returning to FIG. 3B, the method 200 proceeds to an operation 232 where the trenches DT1 and DT2 are filled with a dielectric layer 130, as illustrated in FIG. 20. The dielectric layer 130 may contributes to electrical isolation adjacent TFETs. In some embodiments, the trenches DT1 and DT2 are overfilled with the dielectric layer 130 by using, for example, CVD, PVD, spin-coating, the like, or combinations thereof. Overfilling the trenches DT1 and DT2 results in that the fill metal layers 360 and 460, metal gate layers 350 and 450, gate dielectric layers 340 and 440, second doped epitaxial layers 330 and 430 and first doped epitaxial layers 310 and 410 covered by the dielectric layer 130.

Figure 21:
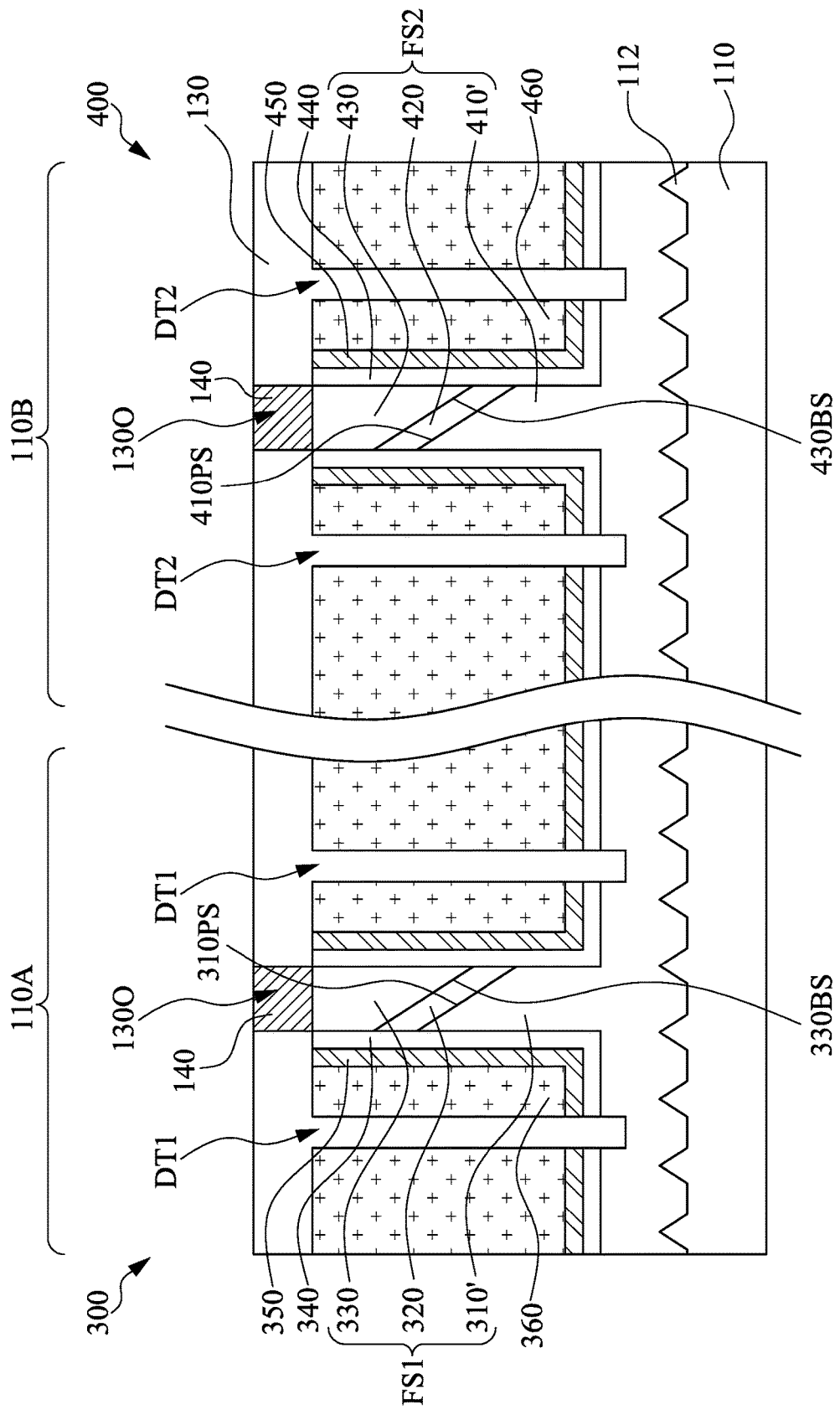

Returning to FIG. 3B, the method 200 proceeds to operation 234 where drain contacts 140 are formed in the dielectric layer 130, as illustrated in FIG. 21. In some embodiments, openings 1300 are etched in the dielectric layer 130 to expose the fin structures FS1 and FS2, followed by depositing a conductive material in the openings 1300 to form the drain contacts 140. A CMP process is optionally carried out to planarize the drain contacts 140 with the dielectric layer 130. To be specific, the openings 1300 expose the respective second doped epitaxial layers 330 and 430, such that the drain contacts 140 can be in contact with the second doped epitaxial layers 330 and 430, respectively. Further TFET processes are performed to form various features such as contacts/vias, interlayer dielectric layers, interconnect metal layers, and passivation layers, etc.

Through above operations, p-type TFET 300 and n-type TFET 400 are formed through an integrated fabrication process. The first doped epitaxial layers 310' and 410' may be formed of the same material with dopants of different polarities. The second doped epitaxial layers 330 and 430 may be formed of the same material with dopants of different polarities. The interlayers 320 and 420 of the TFETs 300 and 400 may be made of the same material. Herein, the TFETs 300 and 400 have slanted heterojunction interfaces (i.e., slanted interfaces between the n-doped GaN layer 310' and the $In_xGa_{(1-x)}N$ layer 320, between the $In_xGa_{(1-x)}N$ layer 320 and the p-doped GaN layer 330, between the p-doped GaN layer 410' and the $In_xGa_{(1-x)}N$ layer 420, between the $In_xGa_{(1-x)}N$ layer 420 and the n-doped GaN layer 430). The slant heterojunction interfaces increase the active area of the TFETs, and thereby improve the on-current per chip area.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that polar $GaN/In_xGa_{(1-x)}N$/polar GaN heterojunctions facilitate interband tunneling of a TFET. Another advantage is that on-current per chip area is improved by designing the TFET with slant heterojunction interfaces. Yet another advantage is that the source and drain of the TFET may be made of the same III-N semiconductor, which in turn will be suitable for CMOS process integration.

According to some embodiments of the present disclosure, a device includes a first epitaxial layer, a second epitaxial layer, an interlayer, a gate dielectric layer, and a gate layer. The interlayer is between the first epitaxial layer and the second epitaxial layer. The gate dielectric layer is around the interlayer. The gate layer is around the gate dielectric layer and the interlayer. The interlayer is slanted with respect to a sidewall of the gate layer.

In some embodiments, the first epitaxial layer, the second epitaxial layer, and the interlayer are stacked to form a fin.

In some embodiments, a top surface of the fin is free from coverage of the gate layer.

In some embodiments, the first epitaxial layer comprises a hexagonal wurtzite crystal structure.

In some embodiments, the first epitaxial layer has a (0001) crystal plane proximate to the interlayer.

In some embodiments, the second epitaxial layer has a (0001) crystal plane proximate to the interlayer.

In some embodiments, the device further includes a substrate having a plurality of triangular prisms, wherein the first epitaxial layer is in contact with the triangular prisms of the substrate.

In some embodiments, the triangular prisms have a (111) crystal plane proximate to the first epitaxial layer.

In some embodiments, the gate dielectric layer is further around the first epitaxial layer and the second epitaxial layer.

In some embodiments, the first epitaxial layer and the second epitaxial layer are of different conductivity types.

According to some embodiments of the present disclosure, a device includes a substrate, a fin, a gate dielectric layer, and a gate layer. The fin includes a bottom portion including a first type semiconductor material, a top portion including a second type semiconductor material, and a middle portion including an interlayer between the first type semiconductor material and the second type semiconductor material. The first type semiconductor material and the second type semiconductor material are of different conductivity types. The gate dielectric layer is around sidewalls of the fin. The gate layer is around the gate dielectric layer. A top surface of the fin is free from coverage of the gate layer.

In some embodiments, the first type semiconductor material has a tapered top.

In some embodiments, the second type semiconductor material has a tapered bottom.

In some embodiments, the gate dielectric layer has a first portion around the first type semiconductor material and a second portion around the second type semiconductor material, and the first portion and the second portion comprises different materials.

In some embodiments, the substrate includes a plurality of triangular prisms thereon, wherein the first type semiconductor material is in contact with the triangular prisms of the substrate.

In some embodiments, the interlayer includes a not-intentionally doped (NID) semiconductor material.

According to some embodiments of the present disclosure, a method includes epitaxially growing a first type semiconductor material over a substrate; etching a recess in the first type semiconductor material with an etchant having an etch rate selectivity greater than 1, in which the etch rate selectivity is a ratio of a first rate of etching a first crystal plane of the first type semiconductor material to a second rate of etching a second crystal plane of the first type semiconductor material; epitaxially growing an interlayer over a bottom surface of the recess; epitaxially growing a second type semiconductor material over the interlayer, wherein the first type semiconductor material and the second type semiconductor material are of different conductivity types; and etching at least the first type semiconductor material to form a fin, wherein the fin comprises the first type semiconductor material, the interlayer, and the second type semiconductor material.

In some embodiments, the method further includes forming a plurality of triangular prisms on the substrate prior to epitaxially growing the first type semiconductor material.

In some embodiments, etching the recess in the first type semiconductor material is performed such that the recess has a bottom surface slanted with respect to a bottom surface of the substrate.

In some embodiments, etching the recess in the first type semiconductor material is performed such the bottom surface of the recess is oriented in the second crystal plane of the first type semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate;
a first source/drain epitaxial layer over the substrate, wherein the first source/drain epitaxial layer has a bottom portion and a protruding portion protruding from a top surface of the bottom portion of the first source/drain epitaxial layer;
a second source/drain epitaxial layer over the protruding portion of the first source/drain epitaxial layer;
an interlayer between the protruding portion of the first source/drain epitaxial layer and the second source/drain epitaxial layer;
a gate dielectric layer around the interlayer, wherein the gate dielectric layer has a first portion extending along sidewalls of the interlayer and a second portion extending along the top surface of the bottom portion of the first source/drain epitaxial layer; and
a gate layer having a first portion extending along a top surface of the second portion of the gate dielectric layer and a second portion extending along and around sidewalls of the first portion of the gate dielectric layer, wherein a bottom surface of the interlayer is slanted with respect to a top surface of the second source/drain epitaxial layer and higher than a top surface of the first portion of the gate layer.

2. The device of claim 1, wherein the first source/drain epitaxial layer, the second source/drain epitaxial layer, and the interlayer are stacked to form a fin.

3. The device of claim 2, wherein a top surface of the fin is free from coverage of the gate layer.

4. The device of claim 1, wherein the first source/drain epitaxial layer comprises a hexagonal wurtzite crystal structure.

5. The device of claim 1, wherein the first source/drain epitaxial layer has a (0001) crystal plane proximate to the interlayer.

6. The device of claim 5, wherein the second source/drain epitaxial layer has a (0001) crystal plane proximate to the interlayer.

7. The device of claim 1, wherein the substrate has a plurality of triangular prisms, wherein the first source/drain epitaxial layer is in contact with the triangular prisms of the substrate.

8. The device of claim 7, wherein the triangular prisms have a (111) crystal plane proximate to the first source/drain epitaxial layer.

9. The device of claim 1, wherein the gate dielectric layer is further around the first source/drain epitaxial layer and the second source/drain epitaxial layer.

10. The device of claim 1, wherein the first source/drain epitaxial layer and the second source/drain epitaxial layer are of different conductivity types.

11. A device, comprising:
a substrate;
a fin over the substrate, the fin comprising a bottom source/drain portion comprising a first type semiconductor material, a top source/drain portion comprising a second type semiconductor material, and a middle portion comprising an interlayer between the first type semiconductor material and the second type semiconductor material, wherein the first type semiconductor material and the second type semiconductor material are of different conductivity types, the interlayer has a first sidewall and a second sidewall opposite to the first sidewall, and the first sidewall of the interlayer is further from the substrate than the second sidewall of the interlayer;
a gate dielectric layer having a first portion extending along and around the first and second sidewalls of the interlayer and a second portion extending laterally from the first portion of the gate dielectric layer; and
a gate layer having a first portion extending along a top surface of the second portion of the gate dielectric layer and a second portion extending along and around sidewalls of the first portion of the gate dielectric layer, wherein a top surface of the fin is free from coverage of the gate layer, and a bottommost portion of the second sidewall of the interlayer is higher than a top surface of the first portion of the gate layer.

12. The device of claim 11, wherein the first type semiconductor material has a tapered top.

13. The device of claim 11, wherein the second type semiconductor material has a tapered bottom.

14. The device of claim 11, wherein the first portion of the gate dielectric layer has a first sub-portion around the first type semiconductor material and a second sub-portion around the second type semiconductor material, and the first sub-portion and the second sub-portion comprise different materials.

15. The device of claim 11, wherein the substrate comprises a plurality of triangular prisms thereon, wherein the first type semiconductor material is in contact with the triangular prisms of the substrate.

16. The device of claim 11, wherein the interlayer comprises a not-intentionally doped (NID) semiconductor material.

17. A device, comprising:
a substrate;
a first source/drain epitaxial layer over the substrate;
an interlayer over the first source/drain epitaxial layer;
a second source/drain epitaxial layer over the interlayer, wherein a topmost portion of the first source/drain epitaxial layer is further from the substrate than a bottommost portion of the second source/drain epitaxial layer;
a gate dielectric layer around the interlayer;
a gate conductor around the gate dielectric layer, the interlayer, and the second source/drain epitaxial layer, wherein the gate conductor extends to a level of a top surface of the second source/drain epitaxial layer over the interlayer, and the top surface of the second source/drain epitaxial layer is free from coverage of the gate conductor; and
a dielectric structure extending through the gate dielectric layer and the gate conductor into the first source/drain epitaxial layer, wherein the dielectric structure has a same sidewall in contact with the gate dielectric layer, the gate conductor, and the first source/drain epitaxial layer.

18. The device of claim 17, wherein the interlayer has a bottom surface in contact with a tapered surface of the first source/drain epitaxial layer.

19. The device of claim 17, wherein the interlayer has a sidewall aligned with a sidewall of the first source/drain epitaxial layer.

20. The device of claim 17, wherein the dielectric structure has a bottom surface in contact with the first source/drain epitaxial layer.

* * * * *